(12) United States Patent
Sakano

(10) Patent No.: US 9,024,331 B2
(45) Date of Patent: May 5, 2015

(54) SUBSTRATE, TEMPLATE SUBSTRATE, SEMICONDUCTOR LIGHT EMITTING ELEMENT, SEMICONDUCTOR LIGHT EMITTING ELEMENT PRODUCING METHOD, ILLUMINATION DEVICE USING SEMICONDUCTOR LIGHT EMITTING ELEMENT AND ELECTRONIC DEVICE

(75) Inventor: Yohei Sakano, Ichihara (JP)

(73) Assignee: Toyoda Gosei Co., Ltd., Aichi (JP)

( * ) Notice: Subject to any disclaimer, the term of this patent is extended or adjusted under 35 U.S.C. 154(b) by 17 days.

(21) Appl. No.: 13/516,295

(22) PCT Filed: Dec. 13, 2010

(86) PCT No.: PCT/JP2010/072375
§ 371 (c)(1),
(2), (4) Date: Jun. 15, 2012

(87) PCT Pub. No.: WO2011/074534
PCT Pub. Date: Jun. 23, 2011

(65) Prior Publication Data
US 2012/0248459 A1 Oct. 4, 2012

(30) Foreign Application Priority Data

Dec. 17, 2009 (JP) ................................. 2009-286938

(51) Int. Cl.
*H01L 33/32* (2010.01)
*H01L 21/02* (2006.01)
(Continued)

(52) U.S. Cl.
CPC ...... *H01L 21/02505* (2013.01); *H01L 21/0237* (2013.01); *H01L 21/0242* (2013.01);
(Continued)

(58) Field of Classification Search
CPC ....... H01L 33/32; H01L 33/20; H01L 33/007; H01L 29/267; H01L 29/7371; H01L 29/2003; H01L 21/0254; H01L 21/02381; H01L 21/02458

USPC .............. 257/507, 627, 76, 13, 103, E33.023, 257/E33.025; 438/46, 47, 479
See application file for complete search history.

(56) References Cited

U.S. PATENT DOCUMENTS

| 6,841,808 B2 | 1/2005 | Shibata et al. |
| 7,528,055 B2 | 5/2009 | Nakahata et al. |

(Continued)

FOREIGN PATENT DOCUMENTS

| JP | 2001-160539 A | 6/2001 |
| JP | 2002-9341 A | 1/2002 |

(Continued)

OTHER PUBLICATIONS

International Search Report for PCT/JP2010/072375 dated Feb. 1, 2011, English Translation.

*Primary Examiner* — Kenneth Parker
*Assistant Examiner* — Bo Fan
(74) *Attorney, Agent, or Firm* — Sughrue Mion, PLLC

(57) ABSTRACT

Disclosed is a semiconductor light emitting element (LC) provided with a substrate (110) having one surface on which plural hexagonal-pyramid-shaped protrusions (110b) are provided, a base layer (130) provided so as to be in contact with the surface on which the protrusions (110b) are provided, an n-type semiconductor layer (140) provided so as to be in contact with the base layer (130), a light emitting layer (150) provided so as to be in contact with the n-type semiconductor layer (140), and a p-type semiconductor layer (160) provided so as to be in contact with the light emitting layer (150). Each protrusion (110b) scatters light in lateral and oblique directions within the semiconductor light emitting element (LC). The protrusions are densely arranged on a substrate on which semiconductor layers are laminated, so that the light extraction efficiency is improved.

10 Claims, 10 Drawing Sheets

(51) Int. Cl.
  *H01L 33/00* (2010.01)
  *C30B 29/20* (2006.01)
(52) U.S. Cl.
  CPC ...... *H01L21/0243* (2013.01); *H01L 21/02458* (2013.01); *H01L 21/0254* (2013.01); *H01L 33/007* (2013.01); *H01L 33/32* (2013.01); *C30B 29/20* (2013.01)

(56) References Cited

U.S. PATENT DOCUMENTS

| | | |
|---|---|---|
| 7,683,386 B2 | 3/2010 | Tanaka et al. |
| 7,759,140 B2 | 7/2010 | Lee et al. |
| 7,834,423 B2 | 11/2010 | Nakahata et al. |
| 8,119,534 B2 | 2/2012 | Tanaka et al. |
| 8,154,035 B2 | 4/2012 | Fudeta |
| 2002/0014629 A1 | 2/2002 | Shibata et al. |
| 2003/0057444 A1* | 3/2003 | Niki et al. ............... 257/200 |
| 2005/0001227 A1 | 1/2005 | Niki et al. |
| 2005/0082546 A1 | 4/2005 | Lee et al. |
| 2005/0179130 A1 | 8/2005 | Tanaka et al. |
| 2006/0226431 A1 | 10/2006 | Lee et al. |
| 2007/0054476 A1 | 3/2007 | Nakahata et al. |
| 2008/0142810 A1* | 6/2008 | Tompa et al. ............... 257/76 |
| 2008/0303043 A1 | 12/2008 | Niki et al. |
| 2009/0042328 A1 | 2/2009 | Niki et al. |
| 2009/0166608 A1 | 7/2009 | Nakanishi et al. |
| 2009/0189253 A1 | 7/2009 | Nakahata et al. |
| 2010/0163901 A1 | 7/2010 | Fudeta |
| 2010/0197055 A1 | 8/2010 | Tanaka et al. |
| 2010/0264445 A1 | 10/2010 | Niki et al. |
| 2010/0264446 A1 | 10/2010 | Niki et al. |
| 2010/0264447 A1 | 10/2010 | Niki et al. |
| 2010/0266815 A1 | 10/2010 | Niki et al. |
| 2010/0267181 A1 | 10/2010 | Niki et al. |
| 2011/0198560 A1 | 8/2011 | Okagawa et al. |
| 2013/0183496 A1 | 7/2013 | Niki et al. |

FOREIGN PATENT DOCUMENTS

| | | |
|---|---|---|
| JP | 2002-353134 A | 12/2002 |
| JP | 2005-101566 A | 4/2005 |
| JP | 2005-129896 A | 5/2005 |
| JP | 2007-73569 A | 3/2007 |
| JP | 2007-184433 A | 7/2007 |
| JP | 2008-010894 A | 1/2008 |
| JP | 2008-288617 A | 11/2008 |
| JP | 2009-141085 A | 6/2009 |
| JP | 2009-194365 A | 8/2009 |
| JP | 2009-200514 A | 9/2009 |
| JP | 2010-171382 A | 8/2010 |
| WO | 2009/102033 A1 | 8/2009 |

* cited by examiner

SUBSTRATE, TEMPLATE SUBSTRATE, SEMICONDUCTOR LIGHT EMITTING ELEMENT, SEMICONDUCTOR LIGHT EMITTING ELEMENT PRODUCING METHOD, ILLUMINATION DEVICE USING SEMICONDUCTOR LIGHT EMITTING ELEMENT AND ELECTRONIC DEVICE

CROSS REFERENCE TO RELATED APPLICATIONS

This application is a National Stage of International Application No. PCT/JP2010/072375 filed Dec. 13, 2010, claiming priority based on Japanese Patent Application No. 2009-286938 filed Dec. 17, 2009, the contents of all of which are incorporated herein by reference in their entirety.

TECHNICAL FIELD

The present invention relates to a substrate, a template substrate, a semiconductor light emitting element, a semiconductor light emitting element producing method, an illumination device using the semiconductor light emitting element and an electronic device.

BACKGROUND ART

Recently, remarkable progress of semiconductor light emitting elements has been made. In particular, as a semiconductor material for light of a shorter wavelength, GaN-based compound semiconductor becomes a focus of attention. GaN-based compound semiconductor is formed by a metal-organic chemical vapor deposition method (MOCVD method), a molecular beam epitaxy method (MBE method) or the like on single crystal sapphire, other various oxides or group III-V compounds as a substrate.

In a semiconductor light emitting element using GaN-based compound semiconductor, a laminated semiconductor layer having a light emitting diode (LED) structure including an n-type semiconductor layer, a light emitting layer and a p-type semiconductor layer is formed on a substrate, and light emitted from the light emitting layer is extracted on a side of a p-electrode provided on the p-type semiconductor layer on an uppermost part.

Efficiency of light extracted from such a semiconductor light emitting element is represented as external quantum efficiency. The external quantum efficiency is a result of multiplying internal quantum efficiency by the light extraction efficiency. The internal quantum efficiency is a ratio of electric energy converted into light to electric energy supplied to the semiconductor light emitting element. The light extraction efficiency is a ratio of light able to be extracted to the outside to light generated within the semiconductor light emitting element.

Factors for reducing the light extraction efficiency include that part of light emitted from the light emitting layer is subjected to total reflection at an interface between the substrate and the n-type semiconductor layer and an interface between the p-electrode and the air and propagates in the lateral direction, and thereby cannot be extracted to the outside.

Consequently, attention is being given to a method in which protrusions such as projections (projecting portions) are provided at an interface between a substrate and an n-type semiconductor layer to scatter the light propagating in the lateral direction by the protrusions, thereby improving the light extraction efficiency. A sapphire substrate provided with the protrusions is referred to as a patterned sapphire substrate (PSS).

In Patent Document 1, there is disclosed a light emitting element in which projections are formed on a surface portion of a substrate, inclined surfaces formed on side surfaces of the projections include at least a first inclined plane and a second inclined plane from a bottom surface side of the substrate, and occurrence of grooves or the like on the projections is prevented at the first inclined plane by setting $\theta 1 > \theta 2$, where $\theta 1$ is an inclination angle of the first inclined plane with respect to the bottom surface and $\theta 2$ is an inclination angle of the second inclined plane with respect to the bottom surface, and thereby generation of pits or voids is suppressed.

In Patent Document 2, there is disclosed a light emitting element in which a projection is a curved surface as a whole having no distinction between an upper portion and a side portion and having no flat surface, and since the surface of the projection in the curved-surface state is a crystal growth plane which is different from a crystal growth direction (c-axis) of a group III nitride compound semiconductor, the group III nitride compound semiconductor does not much grow on the surface of the projection, and thereby thickness for obtaining a flattening film is relatively reduced.

CITATION LIST

Patent Literature

Patent Document 1: Japanese Patent Application Laid-Open Publication No. 2005-101566
Patent Document 2: Japanese Patent Application Laid-open Publication No. 2005-129896

SUMMARY OF INVENTION

Technical Problem

Incidentally, the light extraction efficiency is improved as the protrusions such as projections provided on the substrate are increased to be densely arranged on the substrate. However, in a case where the convex portion is circular shape in the plane shape thereof, when a distance between the protrusions was reduced, dislocations occurred in a location where two adjacent protrusions were the nearest, and crystallinity was deteriorated. Consequently, thickness of semiconductor layers laminated to have a flat surface was increased.

An object of the present invention is to arrange the protrusions more densely on the substrate on which the semiconductor layers are laminated to improve the light extraction efficiency.

Solution to Problem

In order to attain the object, a substrate to which the present invention is applied is a substrate for laminating a semiconductor layer thereon, wherein plural protrusions in a hexagonal-pyramid shape are provided on a surface on which the semiconductor layer is laminated, and a side of a bottom surface of each of the plural protrusions is set in parallel with a side of a bottom surface of an adjacent protrusion.

The plural protrusions provided on the substrate are arranged by locating centers of the bottom surfaces of three protrusions adjacent to one another among the plural protrusions on corners of a triangle, and repeating the triangle.

Further, the substrate is composed of single crystal sapphire whose C-plane is a principal plane.

Then, at least two facing sides of a bottom surface of each protrusion in the hexagonal-pyramid shape among the plural protrusions are set in parallel with an A-axis of the substrate. Alternately, at least two facing sides of a bottom surface of each protrusion in the hexagonal-pyramid shape among the plural protrusions may be set orthogonal to an A-axis of the substrate.

A template substrate to which the present invention is applied includes: a substrate on one surface of which plural protrusions in a hexagonal-pyramid shape are provided, and a side of a bottom surface of each of the plural protrusions is set in parallel with a side of a bottom surface of an adjacent protrusion; and a group III-V compound semiconductor that is epitaxially grown on the one surface of the substrate.

Then, the group III-V compound semiconductor is a compound semiconductor containing gallium (Ga) and nitrogen (N) in a composition thereof.

Further, a semiconductor light emitting element to which the present invention is applied includes: a substrate on one surface of which plural protrusions in a hexagonal-pyramid shape are provided, and a side of a bottom surface of each of the plural protrusions is set in parallel with a side of a bottom surface of an adjacent protrusion; and a laminated semiconductor layer that is provided on the substrate and includes a light emitting layer to emit light of a predetermined wavelength.

Further, from another standpoint, a semiconductor light emitting element producing method includes: a substrate processing step in which plural protrusions in a hexagonal-pyramid shape are provided on one surface of a substrate so that bottom surfaces thereof are adjacent so that facing sides become parallel; and a laminated semiconductor layer forming step in which a laminated semiconductor layer including a light emitting layer to emit light of a predetermined wavelength is formed on the substrate.

Then, the substrate processing step of the semiconductor light emitting element producing method includes: a mask forming step in which plural masks having a planar shape similar to a shape of the bottom surface of the protrusion in the hexagonal-pyramid shape are formed; and a substrate etching step in which the plural protrusions are formed while reducing the planar shape of the plural masks by dry etching.

Further, from still another standpoint, an illumination device to which the present invention is applied includes: a substrate on one surface of which plural protrusions in a hexagonal-pyramid shape are provided, and a side of a bottom surface of each of the plural protrusions is set in parallel with a side of a bottom surface of an adjacent protrusion; and a semiconductor light emitting element having a laminated semiconductor layer that is provided on the substrate and includes a light emitting layer to emit light of a predetermined wavelength.

Further, an electronic device to which the present invention is applied includes: a substrate on one surface of which plural protrusions in a hexagonal-pyramid shape are provided, and a side of a bottom surface of each of the plural protrusions is set in parallel with a side of a bottom surface of an adjacent protrusion; and a semiconductor light emitting element having a laminated semiconductor layer that is provided on the substrate and includes a light emitting layer to emit light of a predetermined wavelength.

Advantageous Effects of Invention

According to the present invention, it is possible to arrange the protrusions more densely on the substrate on which the semiconductor layers are laminated, and thereby improve the light extraction efficiency of the semiconductor light emitting element.

Further, by arranging the protrusions so that at least two sides of the bottom surface (hexagon) of each hexagonal-pyramid-shaped protrusion become parallel to an A-axis of sapphire (<11-20> direction) and growing a base layer, a crystal growth film having excellent crystallinity can be obtained in an early stage of crystal growth (until the C-plane of GaN reaches the vertex of the protrusion), thereby a template substrate with an excellent epitaxial film is produced.

Moreover, by arranging the protrusions so that at least two sides of the bottom surface (hexagon) of each hexagonal-pyramid-shaped protrusion become orthogonal to an A-axis of sapphire (<11-20> direction) and growing a base layer, a crystal growth film having excellent crystallinity can be obtained in or after the medium stage of crystal growth (until the C-plane of GaN is equal to or above the position of the height of the protrusions), thereby a template substrate with an excellent epitaxial film is produced.

By forming the light emitting layer using such a template substrate having excellent crystallinity, it is possible to produce a semiconductor light emitting element with excellent light extraction efficiency and high power, and a illumination device and an electronic device incorporating thereof.

It should be noted that, in this specification, a numeral representing a plane index for indicating crystal orientation added with—refers to the numeral added with an upper bar.

DESCRIPTION OF EMBODIMENTS

Hereinafter, an exemplary embodiment according to the present invention will be described in detail with reference to accompanied drawings. It should be noted that figures shown hereinafter are not to scale.

<Configuration of Semiconductor Light Emitting Element LC>

Figure 1:
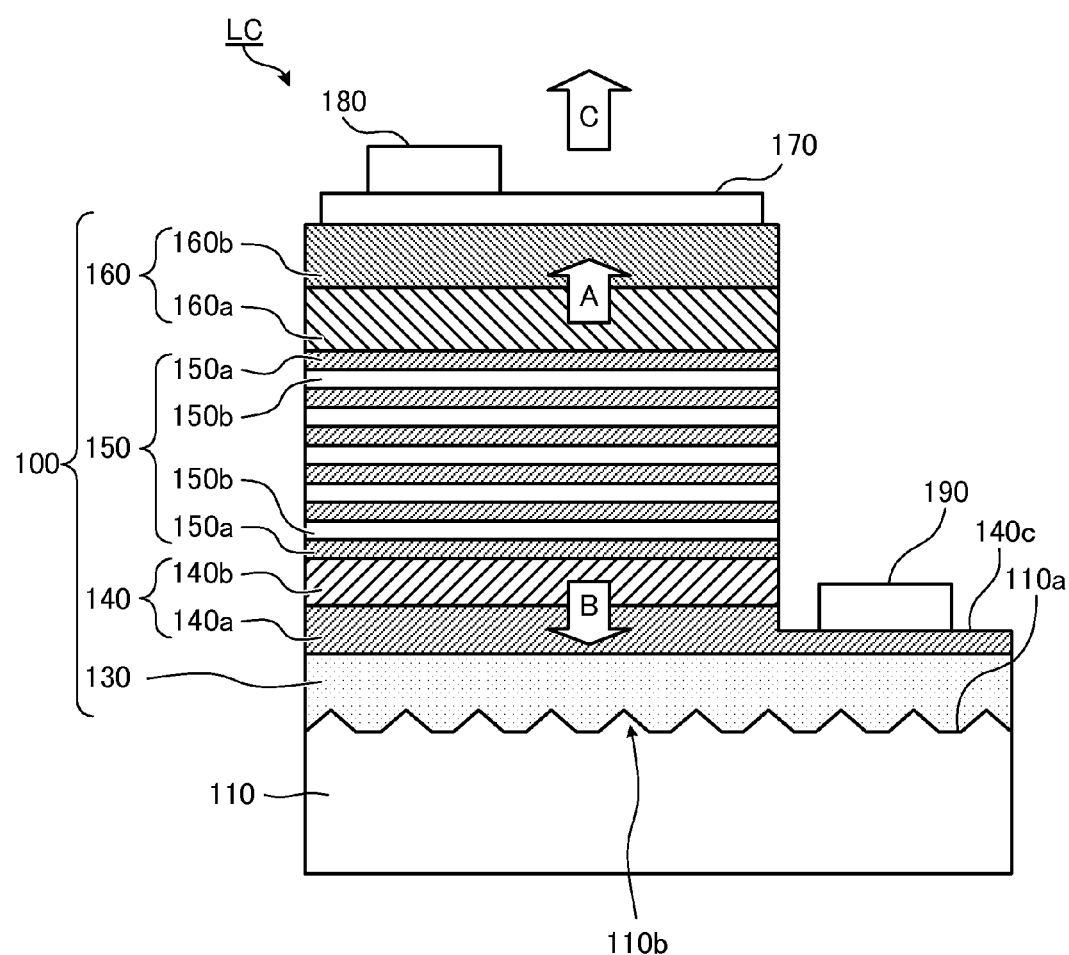
FIG. 1 is a cross-sectional view of an example of a semiconductor light emitting element in the exemplary embodiment.

FIG. 1 is a cross-sectional view of an example of a semiconductor light emitting element LC in the exemplary embodiment.

The compound semiconductor used for this semiconductor light emitting element LC is not particularly limited, and, for example, a group III-V compound semiconductor, a group II-VI compound semiconductor, a group IV-IV compound semiconductor and the like can be provided. Hereinafter, a description will be given by taking the semiconductor light emitting element LC that has a group III nitride compound semiconductor containing Ga (GaN-based compound semiconductor), which is a group III-V compound semiconductor, and emits blue light as an example.

The semiconductor light emitting element LC includes: a substrate 110 on one surface of which plural protrusions 110b are provided; a base layer 130 provided to contact the surface on which the protrusions 110b are provided; an n-type semiconductor layer 140 provided to contact the base layer 130; a light emitting layer 150 provided to contact the n-type semiconductor layer 140; and a p-type semiconductor layer 160 provided to contact the light emitting layer 150.

Here, the n-type semiconductor layer 140 has an n-type contact layer 140a provided to face the base layer 130 and an n-type cladding layer 140b provided to face the light emitting layer 150. In addition, the light emitting layer 150 has a structure in which barrier layers 150a and well layers 150b are alternately laminated and two barrier layers 150a sandwich one well layer 150b. Further, the p-type semiconductor layer 160 has a p-type cladding layer 160a provided to face the light emitting layer 150 and a p-type contact layer 160b provided at an uppermost layer.

It should be noted that, in the following description, the base layer 130, the n-type semiconductor layer 140, the light emitting layer 150 and the p-type semiconductor layer 160 are collectively referred to as a laminated semiconductor layer 100.

Further, the semiconductor light emitting element LC includes a transparent electrode 170 on the p-type contact layer 160b and a p-electrode 180 further thereon. Still further, an n-electrode 190 is provided on an exposed region 140c formed on the n-type contact layer 140a.

The semiconductor light emitting element LC is of a 350 µm square, for example. However, the size of the semiconductor light emitting element LC is freely selected, and a rectangular shape of 240 µm×500 µm, for example, is also used other than the square shape.

(Substrate 110)

The substrate 110 is made of a material different from a material of the group III nitride compound semiconductor, and group III nitride compound semiconductor crystals are epitaxially grown on the substrate 110. As the material constituting the substrate 110, for example, sapphire, carbonized silicon (silicon-carbide: SiC), gallium nitride (GaN), zinc oxide (ZnO), silicon, magnesium oxide, manganese oxide, zirconium oxide, manganese-zinc-iron oxide, magnesium-aluminum oxide, zirconium boride, gallium oxide, indium oxide, lithium-gallium oxide, lithium-aluminum oxide, neodium-gallium oxide, lanthanum-strontium-aluminum-tantalum oxide, strontium-titanium oxide, titanium oxide, hafnium, tungsten, molybdenum, glass such as fused quartz (quartz) or the like can be provided. Among these, sapphire is particularly preferred.

On a surface 110a of the substrate 110 where the base layer 130 is to be formed, the plural protrusions 110b are provided. The protrusion 110b is, as will be described later, formed in a hexagonal-pyramid shape.

The protrusions 110b may be formed by applying a process on the substrate 110, or may be configured with a material different from that of the substrate 110. In the case where sapphire is used for the substrate 110, as the material different from that of the substrate 110, gallium nitride (GaN), carbonized silicon (silicon-carbide: SiC), zinc oxide (ZnO) or the like can be used.

Hereinafter, a description will be given on an assumption that the protrusions 110b are configured by processing the substrate 110. It should be noted that, in the case where the protrusions 110b are formed by processing the substrate 110, the term of the substrate 110 is used in both of a state before the protrusions 110b are processed and a state after the protrusions 110b are formed.

In the protrusion 110b in the hexagonal-pyramid shape, a bottom surface thereof is a regular hexagon inscribed in a circle having a diameter of 0.1 µm to 5 µm, preferably 0.5 µm to 3 µm, and more preferably 1 µm to 2.5 µm. A center-to-center distance between two adjacent protrusions 110b is 0.25 µm to 10 µm, preferably 0.5 µm to 5 µm, and more preferably 1 µm to 3 µm. The height of the protrusion 110b is 0.1 µm to 3 µm, preferably 0.3 µm to 2 µm, and more preferably 0.5 µm to 1 µm.

A configuration of the protrusions 110b will be described in detail later.

(Intermediate Layer)

An intermediate layer (also referred to as a buffer layer) is not shown in FIG. 1; however, the intermediate layer is preferably formed on the substrate 110 and the base layer 130, which will be described later, is formed via the intermediate layer. The intermediate layer can be composed of polycrystal $Al_xGa_{1-x}N$ ($0 \leq x \leq 1$) (for example, AlN is typically used) with a thickness of 0.01 µm to 0.5 µm. Moreover, single crystal $Al_xGa_{1-x}N$ ($0 \leq x \leq 1$) is more preferred rather than polycrystal. If the thickness of the intermediate layer is less than 0.01 µm, there are some cases where an effect of the intermediate layer to mediate the difference in lattice constant between the substrate 110 and the base layer 130 cannot be sufficiently obtained. In addition, if the thickness of the intermediate layer is more than 0.5 µm, there is a possibility that the time of forming process of the intermediate layer becomes longer though there is no change to the function of the intermediate layer, and accordingly the productivity is decreased. It should be noted that it is preferable to form the intermediate layer in the present invention, but the intermediate layer is not necessarily formed.

(Base Layer 130)

As a material for the base layer 130, GaN-based compound semiconductor is used, and in particular, GaN or AlGaN can be preferably used.

The base layer 130 is epitaxially grown from the flat surface 110a of the substrate 110. The base layer 130 is grown to fill spaces among the protrusions 110b. Further, the base layer 130 is grown beyond a top of the protrusion 110b, and comes to cover the entire surface of the substrate 110. In the case where the intermediate layer is provided, the base layer 130 is also epitaxially grown from the intermediate layer on the flat surface 110a of the substrate 110 to fill the spaces among the protrusions 110b.

The thickness of the base layer 130 is larger than the height of the protrusion 110b, that is, 0.2 µm or more, preferably 0.5

μm or more, and more preferably 1 μm or more. Moreover, the thickness of the base layer 130 is preferably 10 μm or less in terms of productivity.

To improve crystallinity of the base layer 130, it is preferable that the base layer 130 is not added with impurities.

(n-Type Semiconductor Layer 140)

The n-type semiconductor layer 140 is configured with the n-type contact layer 140a and the n-type cladding layer 140b.

Here, as the n-type contact layer 140a, similar to the base layer 130, GaN-based compound semiconductor is used. Further, GaN-based compound semiconductor which constitutes the base layer 130 and the n-type contact layer 140a have preferably the identical composition, and the total thickness of these layers is set in the range of 0.1 μm to 20 μm, preferably in the range of 0.5 μm to 15 μm, and more preferably in the range of 1 μm to 12 μm.

Further, the n-type contact layer 140a is preferably doped with n-type impurities, and it is preferable to contain the n-type impurities having a concentration of $1\times10^{17}/cm^3$ to $1\times10^{20}/cm^3$, and a concentration of $1\times10^{18}/cm^3$ to $1\times10^{19}/cm^3$ is more preferable on the point that a good ohmic contact with the n-electrode 190 can be maintained. As the n-type impurities, though there is no particular limitation, Si, Ge, Sn and so on are provided, and Si and Ge are preferably provided.

On the other hand, the n-type cladding layer 140b can be formed of AlGaN, GaN, GaInN and so on. It should be noted that, in this specification, AlGaN, GaN and GaInN are described with the compositional ratio of each element being omitted in some cases. Further, hetero junction of these structures or a superlattice structure in which these structures are laminated plural times may also be employed.

The thickness of the n-type cladding layer 140b is preferably in the range of 5 nm to 500 nm, and more preferably in the range of 5 nm to 100 nm. The n-type impurity concentration of the n-type cladding layer 140b is preferably in the range of $1\times10^{17}/cm^3$ to $1\times10^{20}/cm^3$, and more preferably in the range of $1\times10^{18}/cm^3$ to $1\times10^{19}/cm^3$. It is preferable to provide the n-type impurity concentration in these ranges in terms of maintaining excellent crystallinity and reducing operation voltage of the light emitting element.

(Light Emitting Layer 150)

The light emitting layer 150 is formed by alternately laminating the barrier layers 150a made of GaN-based compound semiconductor and the well layers 150b made of GaN-based compound semiconductor containing In in a repeated manner, and the barrier layers 150a are provided in such an order to face the n-type semiconductor layer 140 and the p-type semiconductor layer 160, respectively. In the exemplary embodiment, the light emitting layer 150 is configured so that six barrier layers 150a and five well layers 150b are alternately laminated in a repeated manner, the barrier layers 150a are arranged as the uppermost and lowermost layers of the light emitting layer 150, and the well layers 150b are arranged between the barrier layers 150a.

As the well layer 150b, as the GaN-based compound semiconductor containing In, for example, $Ga_{1-s}In_sN$ ($0<s<0.4$) or the like can be used.

Further, as the barrier layer 150a, GaN-based compound semiconductor, such as $Al_cGa_{1-c}N$ ($0\leq c\leq 0.3$), which has a larger band gap energy than that of the well layer 150b, can be preferably used.

The thickness of the well layer 150b is not particularly limited; however, the thickness by which quantum effects can be obtained is preferred.

(p-Type Semiconductor Layer 160)

The p-type semiconductor layer 160 is configured with the p-type cladding layer 160a and the p-type contact layer 160b.

As the p-type cladding layer 160a, $Al_dGa_{1-d}N$ ($0<d\leq 0.4$) is preferably provided. The thickness of the p-type cladding layer 160a is preferably in the range of 1 nm to 400 nm, and more preferably in the range of 5 nm to 100 nm. The p-type impurity concentration of the p-type cladding layer 160a is preferably $1\times10^{18}/cm^3$ to $1\times10^{21}/cm^3$, and more preferably $1\times10^{19}/cm^3$ to $5\times10^{20}/cm^3$. If the p-type impurity concentration is in the above ranges, excellent p-type semiconductor crystals can be obtained without deteriorating crystallinity.

On the other hand, as the p-type contact layer 160b, GaN-based compound semiconductor layer, such as $Al_eGa_{1-e}N$ ($0\leq e<0.5$), can be provided. The thickness of the p-type contact layer 160b is not particularly limited, but is preferably 10 nm to 500 nm, and more preferably 50 nm to 200 nm. It is preferable to provide the p-type impurity concentration of $1\times10^{18}/cm^3$ to $1\times10^{21}/cm^3$, and more preferably $5\times10^{19}/cm^3$ to $5\times10^{20}/cm^3$, in terms of maintaining good ohmic contact, preventing cracking and maintaining excellent crystallinity. The p-type impurities are not particularly limited, but, for example, Mg is preferably provided.

(Transparent Electrode 170)

As a material constituting the transparent electrode 170, conventionally-known materials such as IZO ($In_2O_3$—ZnO), ITO ($In_2O_3$—$SnO_2$), AZO (ZnO—$Al_2O_3$) and GZO (ZnO—$Ga_2O_3$) may be provided. Moreover, the structure of the transparent electrode 170 is not particularly limited, and any conventionally-known structures can be employed. The transparent electrode 170 may be formed to cover the almost entire surface of the p-type semiconductor layer 160 and may also be formed in a lattice shape or a tree shape.

(p-Electrode 180)

The p-electrode 180, which is formed on the transparent electrode 170 and makes ohmic contact with the transparent electrode 170, is constituted by conventionally-known materials such as Au, Al, Ti, V, Cr, Mn, Co, Zn, Ge, Zr, Nb, Mo, Ru, Ta, Ni and Cu. The structure of the p-electrode 180 is not particularly limited, and conventionally-known structures may be employed.

The thickness of the p-electrode 180 is, for example, in the range of 100 nm to 2000 nm, and preferably in the range of 300 nm to 1000 nm.

(n-Electrode 190)

The n-electrode 190 is in contact with the n-type contact layer 140a of the n-type semiconductor layer 140. In other words, part of the p-type semiconductor layer 160, light emitting layer 150 and n-type semiconductor layer 140 of the laminated semiconductor layer 100 (the base layer 130, the n-type semiconductor layer 140, the light emitting layer 150 and the p-type semiconductor layer 160) is removed to form the exposed region 140c of the n-type contact layer 140a, and the n-electrode 190 is provided thereon.

As a material of the n-electrode 190, composition and structure thereof may be the same as those of the p-electrode 180, and n-electrodes of various materials and structures are conventionally known, and these n-electrodes can be used without any limitation and provided by any well-known method in this technical field.

<Light Emitting Operation of Semiconductor Light Emitting Element LC>

Light emitting operation of the semiconductor light emitting element LC shown in FIG. 1 will be described.

From a terminal provided outside of the semiconductor light emitting element LC, a current from the p-electrode 180 toward the n-electrode 190 of the semiconductor light emitting element LC is passed. Then, the current flows from the p-electrode 180 toward the n-electrode 190 through the p-type semiconductor layer 160, the light emitting layer 150 and the n-type semiconductor layer 140, and the light emitting layer 150 emits blue light toward all directions. Here, in FIG. 1, light in the direction of arrow A toward the transparent electrode 170 and light in the direction of arrow B toward the base layer 130 are exemplified.

Of the light emitted from the light emitting layer 150, the light in the direction of arrow A toward the transparent electrode 170 transmits the p-type semiconductor layer 160 and the transparent electrode 170, and is emitted to the outside of the semiconductor light emitting element LC as light in the direction of arrow C.

Of the light emitted from the light emitting layer 150, the light in the direction of arrow B toward the base layer 130 transmits the n-type semiconductor layer 140, the base layer 130 and the substrate 110, and is absorbed and/or reflected by a package or a circuit board (not shown) onto which the semiconductor light emitting element LC is mounted.

However, as described above, the light emitting layer 150 emits not only the light toward the direction of arrow A and the direction of arrow B, but also light toward the lateral direction and the oblique direction in FIG. 1.

Here, in the case where the protrusions 110b are not provided, of the light obliquely incident upon the interface between the base layer 130 and the substrate 110, the light of a critical angle or more is totally reflected by the interface between the base layer 130 and the substrate 110. The light totally reflected by the interface between the base layer 130 and the substrate 110 is totally reflected by the interface between the transparent electrode 170 and the air. And thereafter, the light is totally reflected by the interface between the base layer 130 and the substrate 110 again. In this manner, total reflection is repeated between the interface of the base layer 130 and the substrate 110 and the interface of the transparent electrode 170 and the air. Accordingly, light propagating in the lateral direction within the semiconductor light emitting element LC is provided. As a result, the light extraction efficiency from the light emitting element LC has been deteriorated.

It should be noted that, in the case where the base layer 130 is composed of GaN, a refractive index of GaN in the blue region is 2.4, and in the case where the substrate 110 is composed of sapphire, a refractive index of sapphire in the blue region is 1.78. Consequently, the light having an incident angle of 47.9° or more is totally reflected by the interface between the base layer 130 and the substrate 110.

On the other hand, in the case where the transparent electrode 170 is composed of IZO, a refractive index of IZO in the blue region is 2.1 to 2.15. Consequently, the light having an incident angle of 28.4° or more is totally reflected by the interface between the transparent electrode 170 and the air.

Accordingly, the light having an incident angle of 47.9° or more is repeatedly subjected to total reflection between the above-described two interfaces, and propagates in the lateral direction within the semiconductor light emitting element LC.

It should be noted that, since any of the base layer 130, the n-type semiconductor layer 140, the light emitting layer 150 and the p-type semiconductor layer 160 constituting the laminated semiconductor layer 100 is configured with GaN-based compound semiconductor, there is a small difference in refractive indexes; therefore, reflection by the interfaces of these layers hardly occurs. Similarly, a difference in refractive indexes between the p-type semiconductor layer 160 and the transparent electrode 170 is small, and therefore, reflection hardly occurs.

In contrast, if the protrusions 110b are provided on the substrate 110, part of light totally reflected by the flat surface 110a of the substrate 110 is scattered by the protrusions 110b, and propagation in the lateral direction within the semiconductor light emitting element LC is inhibited. This facilitates improvement of the light extraction efficiency of the semiconductor light emitting element LC.

Accordingly, the more the plural protrusions arranged on the substrate 110 more densely, the more the light extraction efficiency of the semiconductor light emitting element LC is improved.

<Arrangement and Shape of Protrusions 110b on Substrate 110>

Figure 2A:
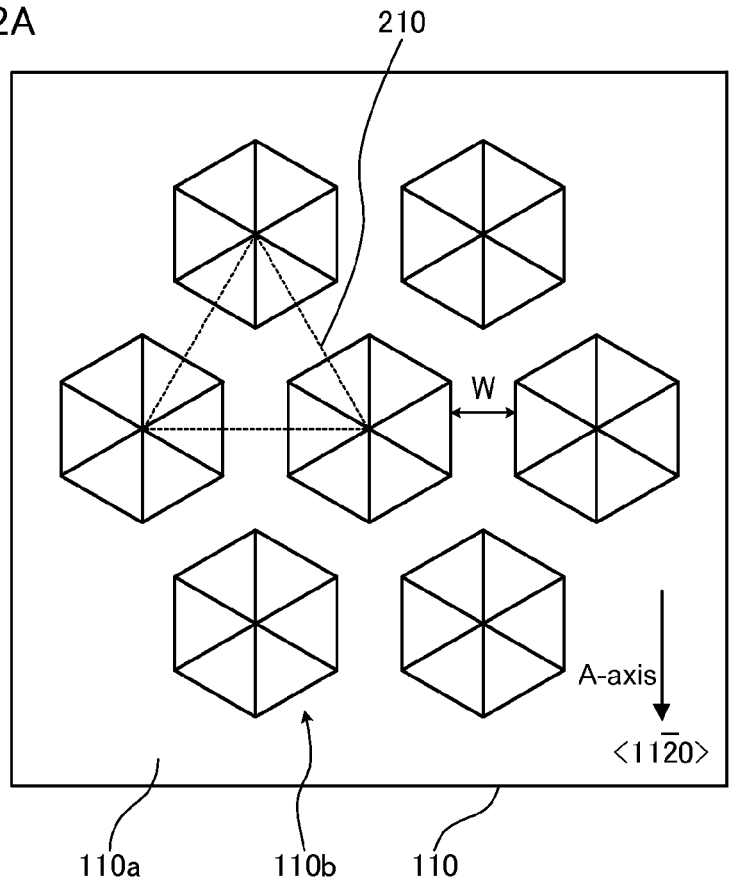
FIGS. 2A and 2B are diagrams showing an example of arrangement and shape of the protrusions on the substrate in the exemplary embodiment.
Figure 2B:
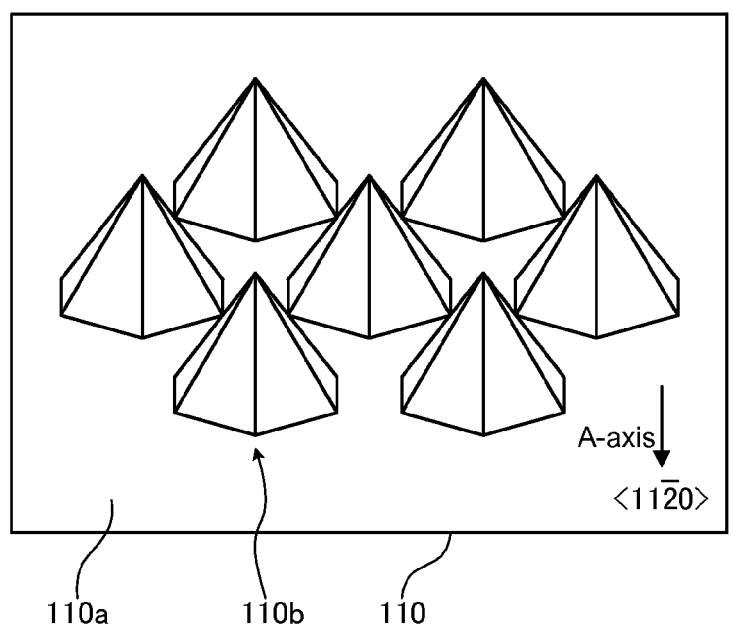

FIGS. 2A and 2B show an example of arrangement and shape of the protrusions 110b on the substrate 110 in the exemplary embodiment. FIG. 2A is a diagram showing an arrangement of the protrusions 110b on the substrate 110 and FIG. 2B is a perspective view showing the shape of the protrusions 110b on the substrate 110.

As shown in FIGS. 2A and 2B, the protrusion 110b is in the hexagonal-pyramid shape. The protrusion 110b has a hexagonal bottom surface, and is tapered from the bottom surface toward a vertex to have a pointed tip. It is unnecessary for the protrusion 110b to be a geometrically-perfect hexagonal pyramid, and edges thereof may be rounded by reason of processing or the like. In addition, the protrusion 110b may have a circular-conic shape with edges thereof being removed in a portion near the vertex of the hexagonal pyramid. Here, the shape of the protrusion 110b, including these shapes, is referred to as a hexagonal-pyramid shape.

The bottom surface of the protrusion 110b is, for example, a regular hexagon as shown in FIG. 2A. The adjacent protrusions 110b are arranged so that centers of the bottom surfaces thereof are placed on corners of a regular triangle 210. This makes sides of the hexagon of the bottom surface of the protrusion 110b parallel to sides of the hexagon of the bottom surface of the adjacent protrusion 110b with each other. In the two adjacent protrusions 110b, the distance W between the sides of the hexagons in the respective bottom surfaces is constant.

With the above-described arrangement of the protrusions 110b, the protrusions 110b are densely arranged on the substrate 110, and therefore, it is preferable.

Hereinafter, a description will be given on the assumption that the substrate 110 is sapphire, for example, and that the flat surface 110a, except for the portion of the protrusions 110b, is the C-plane of sapphire. Further, the GaN-based compound semiconductor grown on the flat surface 110a is described as GaN as an example of the GaN-based compound semiconductor.

The A-axis direction (<11-20> direction) orthogonal to the A-plane (11-20) of sapphire and a direction of at least a pair of two facing sides of the six sides of the hexagon of the bottom surface of the protrusion 110b are made to be parallel. Therefore, in the example in which the protrusions 110b in the hexagonal-pyramid shape are arranged as shown in FIG. 2A, a layer having good crystallinity is formed in an early stage of growth of the base layer 130, as will be described later.

Figure 3A:
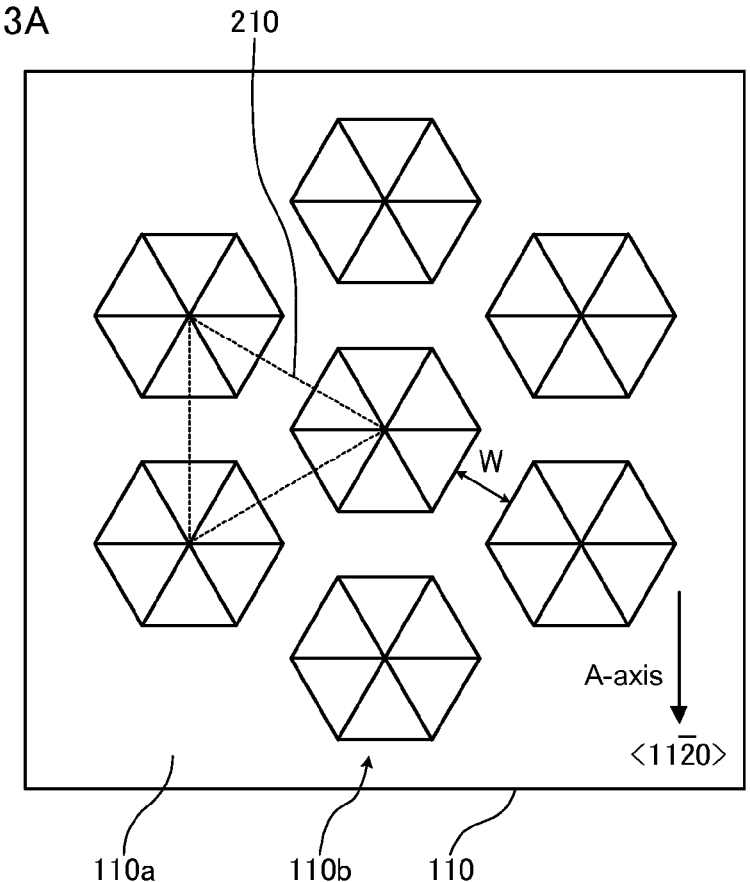
FIGS. 3A and 3B are diagrams showing an example of another arrangement of the protrusions in the exemplary embodiment.
Figure 3B:
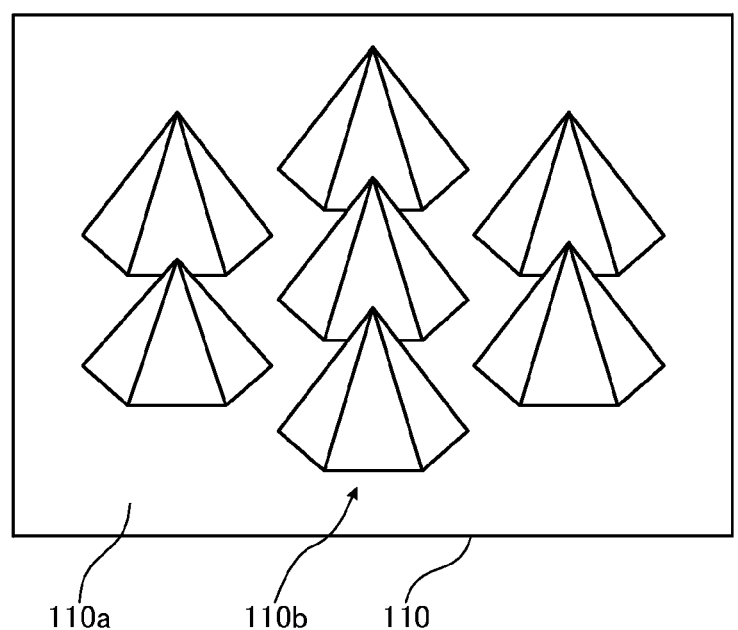

On the other hand, FIGS. 3A and 3B are diagrams showing an example of another arrangement of the protrusions 110b in the exemplary embodiment. FIG. 3A shows the arrangement of the protrusions 110b on the substrate 110, and FIG. 3B shows the shape of the protrusions 110b on the substrate 110. With regard to configurations similar to those in FIGS. 2A and 2B, same symbols are assigned and detailed description is omitted.

Also in the following description, a description will be given on the assumption that the substrate 110 is sapphire, for example, and that the flat surface 110a, except for the portion of the protrusions 110b, is the C-plane of sapphire. Further, the GaN-based compound semiconductor that grows on the flat surface 110a is described as GaN as an example of the GaN-based compound semiconductor.

The protrusion 110b in FIGS. 3A and 3B is, similar to that in FIGS. 2A and 2B, in the hexagonal-pyramid shape. However, the A-axis direction (<11-20> direction) orthogonal to the A-plane (11-20) of sapphire and a direction of at least a pair of two facing sides of the six sides of the hexagon of the bottom surface of the protrusion 110b are made to be orthogonal. In other words, the protrusion 110b shown in FIGS. 3A and 3B is rotated 30° from the protrusion 110b shown in FIGS. 2A and 2B with respect to the center of the hexagon of the bottom surface thereof. Accordingly, in the example in which the protrusions 110b in the hexagonal-pyramid shape are arranged as shown in FIG. 3A, there is a possibility that crystal growth is inhibited in an early stage of the crystal growth, and thereby crystallinity is deteriorated. However, on or after the surface of the base layer 130 reaches the vertex of the protrusion 110b, crystallinity of the base layer 130 is significantly improved in comparison with the arrangement of the protrusions 110b in the hexagonal-pyramid shape shown in FIG. 2A.

In this manner, the adjacent protrusions 110b are arranged so that the centers of the bottom surfaces thereof are placed on the corners of the regular triangle 210. This makes a side of a hexagon of the bottom surface of the protrusion 110b and a side of a hexagon of the bottom surface of the adjacent protrusion 110b parallel with each other. And, in the two adjacent protrusions 110b, a distance W between the sides of the hexagons of the respective bottom surfaces is constant.

It should be noted that, in FIGS. 2A, 2B, 3A and 3B, the description has been given by assuming that the bottom surface of the protrusion 110b is a regular hexagon; however, the bottom surface thereof may be a hexagon in which facing sides are parallel. Then, it is preferable to arrange the protrusions 110b so that, in the two adjacent protrusions 110b, a distance W between facing sides becomes constant.

Moreover, in FIGS. 2A, 2B, 3A and 3B, the description has been given to two examples of orientation of the bottom surfaces of the protrusions 110b; however, the orientation of the bottom surfaces of the protrusions 110b may not be of the above-described two cases, and may be configured with an arbitrary angle with the crystal orientation <11-20> on the C-plane of the substrate 110.

<Producing Method of Semiconductor Light Emitting Element LC>

Next, a producing method of the semiconductor light emitting element LC in the exemplary embodiment will be described.

Figure 4:
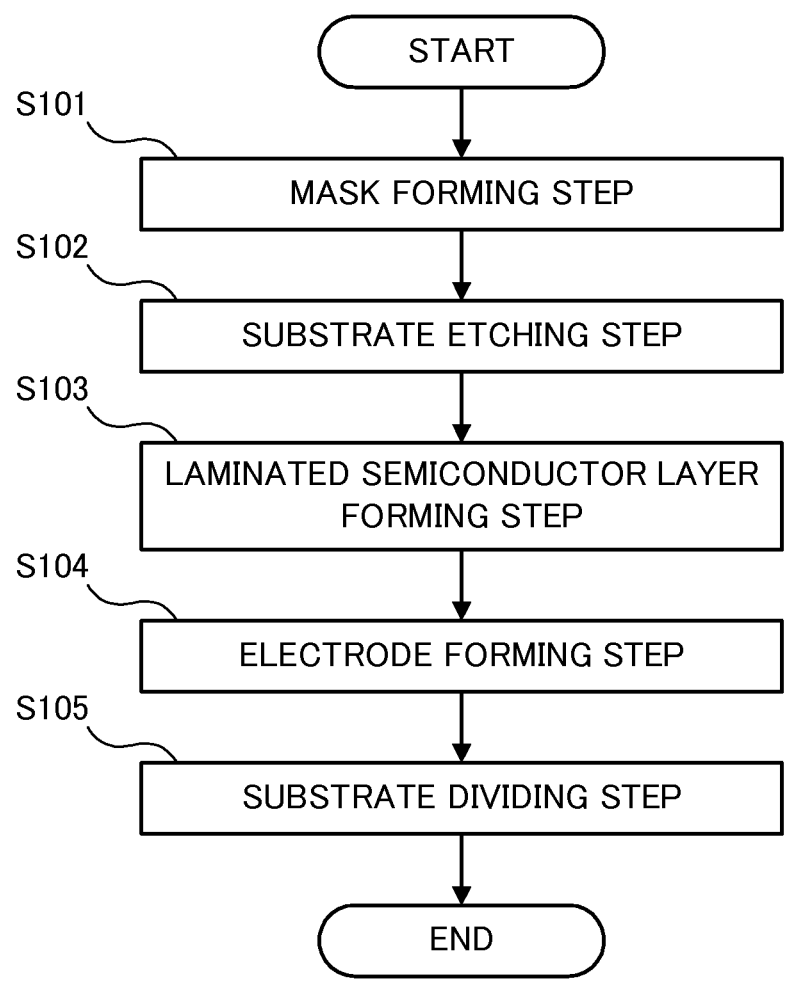
FIG. 4 is a flowchart illustrating a producing method of the semiconductor light emitting element in the exemplary embodiment.

FIG. 4 is a flowchart illustrating the producing method of the semiconductor light emitting element LC in the exemplary embodiment. FIGS. 5A to 5G are cross-sectional views in the course of each process of the producing method of the semiconductor light emitting element LC of the exemplary embodiment. The process proceeds in the order of FIGS. 5A to 5G. FIGS. 5A to 5G show cross-sectional views of four semiconductor light emitting elements LC produced on a single substrate 110. It should be noted that, of the four semiconductor light emitting elements LC, two in both ends are partially shown.

While referring to FIGS. 5A to 5G, the producing method of the semiconductor light emitting element LC will be described in accordance with the flowchart in FIG. 4.

The producing method of the semiconductor light emitting element LC in the exemplary embodiment includes a mask forming step, a substrate etching step, a laminated semiconductor layer forming step, an electrode forming step and a substrate dividing step. Of these steps, the mask forming step and the substrate etching step are a substrate processing step for providing the protrusions 110b on the substrate 110. Hereinafter, descriptions will be given in order.

(Mask Forming Step)

Figure 5A:
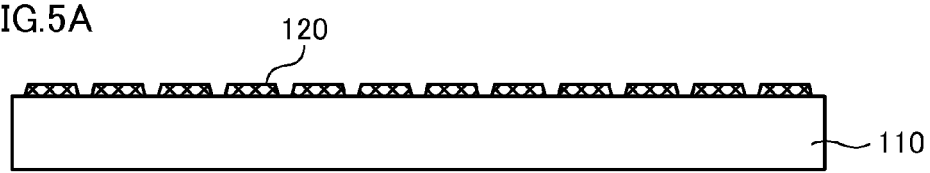
FIGS. 5A to 5G are cross-sectional views in the course of each process of the producing method of the semiconductor light emitting element of the exemplary embodiment.

As shown in FIG. 5A, the mask forming step forms a mask 120 with a photoresist on the substrate 110 (step 101). After applying the photoresist on the substrate 110, the mask 120 of the photoresist is formed to have a planar shape which is same or similar to that of the bottom surface of the protrusion 110b (hexagon) by a conventionally-known photolithographic technology. The planar shape of the mask 120 may be set so that the predetermined shape thereof is the shape of the bottom surface of the formed protrusion 110b. Accordingly, the planar shape of the mask 120 by the photoresist may be the same shape or the similar shape as that of the bottom surface of the formed protrusion 110b.

It should be noted that, as shown in FIGS. 2A and 2B or FIGS. 3A and 3B, in the case where the direction of the bottom surface (hexagon) of the protrusion 110b and the orientation of the substrate 110 are made to coincide, for example, an orientation flat (OF) processed in the A-axis direction (<11-20> direction) is provided in the rim of the sapphire substrate 110, in which the C-plane is a principal plane, and the orientation of the mask 120 may be set with respect to the OF.

(Substrate Etching Step)

Next, etching is performed on the substrate 110 on which the mask 120 is formed (step 102). For etching of the substrate 110, dry etching or wet etching can be employed. Among them, it is preferable to use dry etching. For example, conventionally-known plasma etching method, reactive ion etching (RIE) method, magnetron RIE method, ion milling method and the like may be used. As an etching gas, a chlorine (Cl)-based or halogen-based gas, such as $Cl_2$, $SiCl_4$, $BCl_3$, HBr, $SF_6$, $CHF_3$, $C_4F_8$ and $CF_4$, may be used. Further, Ar, which is an inactive gas, or the like may also be used.

Figure 5B:
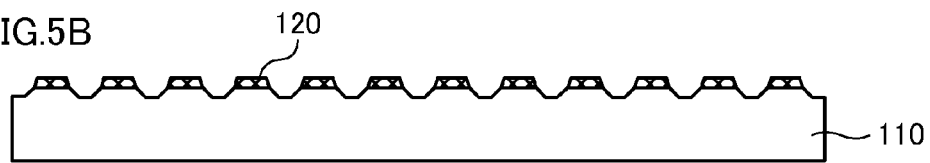
Figure 5C:
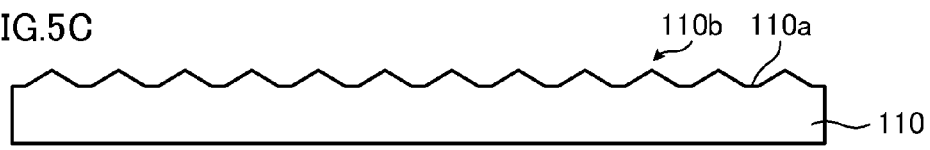

In the substrate etching step, as shown in FIG. 5B, by also etching the mask 120 during the course of etching of the substrate 110, the edge of the mask 120 is recessed in the direction toward the center of the mask 120, and thereby the planar shape thereof is made smaller. With that, part of the substrate 110 that becomes a side surface of the protrusion 110b is formed to be a shape including inclination (a tapered state). Then, as shown in FIG. 5C, etching is proceeded until the mask 120 becomes lost to form the protrusion 110b in the hexagonal-pyramid shape.

As described above, by performing etching of the mask 120, as well as etching of the substrate 110, it is possible to form the protrusion 110b in the hexagonal-pyramid shape having a vertex. For doing this, it is preferable that an etching rate of the substrate 110 and an etching rate of the mask 120 are close value (selection ratio is small). As an etching method in which material dependency of etching rate is small, a method that physically performs etching on a material by impact of ions or particles is provided. Therefore, etching that combines physical etching and chemical etching may be used. In this case, it is preferable to use a gas containing Ar. Further, physical etching using only Ar may be performed.

In physical etching, an etching rate becomes larger in the case where ions or the like obliquely collide against a surface of a material than in the case where ions or the like vertically collide against a surface of a material. Consequently, the side wall of the mask 120 is preferably inclined so that the upper part thereof becomes smaller than the lower part thereof, rather than being vertical. The etching rate of the side wall becomes larger than that of the surface of the mask 120 to accelerate recession of the edge of the mask 120, and thereby formation of the protrusion 110b in the hexagonal-pyramid shape is made easier.

It should be noted that, if a specific crystal orientation of the substrate 110 is not selectively subjected to etching and protrusions 110b in a predetermined hexagonal-pyramid shape are to be formed, the protrusions 110b may be formed by chemical dry etching or wet etching.

As described above, in the exemplary embodiment, photoresist is used as a material of the mask 120; however, other materials may be used. In that occasion, any other material is processed into the shape of the mask 120 by using a conventionally-known photolithography. Thereafter, similar to the above description, the substrate etching step may be carried out. The substrate etching step may be performed with the photoresist to be processed into the shape of the mask 120 being left, or with the photoresist being removed.

The substrate 110 on which the protrusions 110b have been formed may be stored or sold to separately perform the following steps.

(Laminated Semiconductor Layer Forming Step)

Next, the laminated semiconductor layer 100 is formed on the substrate 110 on which the protrusions 110b have been formed (step 103). The laminated semiconductor layer forming step includes a base layer forming step, an n-type semiconductor layer forming step, a light emitting layer forming step and a p-type semiconductor layer forming step. It should be noted that, though description will be omitted here, an intermediate layer forming step may be provided before the base layer forming step in the laminated semiconductor layer forming step. Hereinafter, descriptions will be given in order.

(Base Layer Forming Step)

Figure 5D:
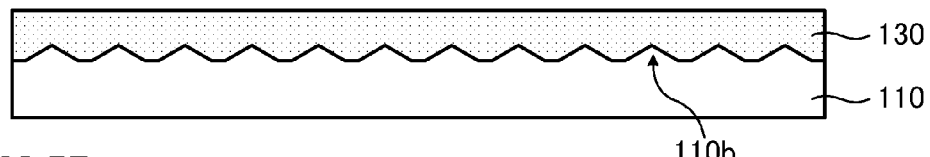

First, as shown in FIG. 5D, the base layer 130 is formed on the substrate 110 on which the protrusions 110b have been formed.

Formation of the base layer 130 can be performed by using a conventionally-known metal organic chemical vapor deposition (MOCVD) method.

For example, in the case where sapphire whose C-plane is a principal plane is used as the substrate 110, the flat surface 110a of the substrate 110 except for the protrusions 110b constitutes the C-plane.

Then, the base layer 130 grows to fill the spaces among the protrusions 110b. Formation is carried out until the base layer 130 covers the protrusions 110b and makes the surface thereof flat.

The substrate 110 on which at least the base layer 130 has been formed may be stored or sold to separately perform the following steps as a template substrate on which the light emitting layer 150 is to be formed.

(n-Type Semiconductor Layer Forming Step)

Figure 5E:
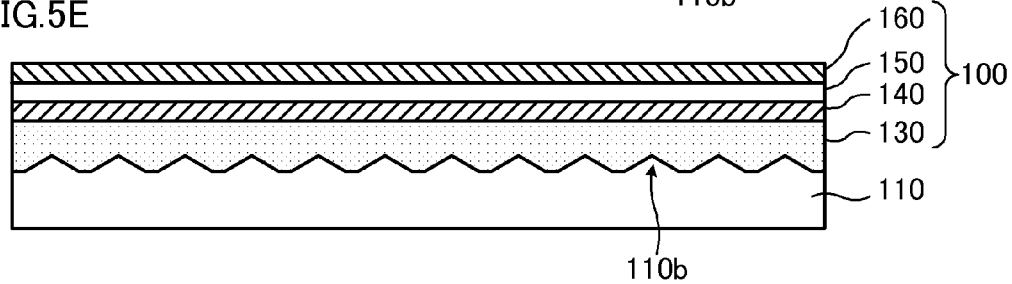

Next, after the base layer 130 is formed, the n-type contact layer 140a and the n-type cladding layer 140b are laminated to form the n-type semiconductor layer 140 as shown in FIG. 5E. The n-type contact layer 140a and the n-type cladding layer 140b may be formed by a sputtering method or an MOCVD method. Similar to above, the substrate 110 on which the n-type contact layer 140a or the n-type cladding layer 140b has been formed may be stored or sold to separately perform the next step as a template substrate on which the light emitting layer 150 is to be formed.

(Light Emitting Layer Forming Step)

After the n-type semiconductor layer 140 is formed, the light emitting layer 150 is formed as shown in FIG. 5E. Formation of the light emitting layer 150 may be carried out by any of the sputtering method and MOCVD method; however, the MOCVD method is particularly preferred. Specifically, the barrier layers 150a and the well layers 150b may be alternately laminated in a repeated manner, and also laminated in the order such that barrier layers 150a face the n-type semiconductor layer 140 and the p-type semiconductor layer 160.

(p-Type Semiconductor Layer Forming Step)

Further, after the light emitting element 150 is formed, the p-type semiconductor layer 160 is formed as shown in FIG. 5E. Formation of the p-type semiconductor layer 160 may be carried out by any of the sputtering method and MOCVD method. Specifically, the p-type cladding layer 160a and the p-type contact layer 160b may be laminated in order.

It should be noted that it is preferable to continuously form the laminated semiconductor layer 100 (the base layer 130, the n-type semiconductor layer 140, the light emitting layer 150 and the p-type semiconductor layer 160) without breaking a vacuum state. This is due to a reason for suppressing contamination of the interface between the layers by impurities or the like.

(Electrode Forming Step)

The electrode forming step includes a transparent electrode forming step, an exposed region forming step and a p-electrode and n-electrode forming step (step 104).

(Transparent Electrode Forming Step)

Figure 5F:
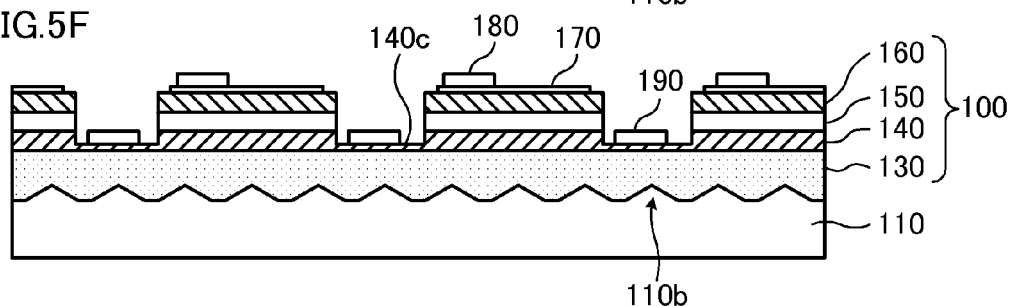

As shown in FIG. 5F, after a layer of the transparent electrode 170 is formed on the p-type semiconductor layer 160 using a conventionally-known method, such as a sputtering method, a resist pattern is formed by a conventionally-known photolithographic method, and the transparent electrode 170 is formed by the conventionally-known chemical etching method or dry etching method or the like.

(Exposed Region Forming Step)

For removing a part of the laminated semiconductor layer 100 in a predetermined region, a resist pattern is formed by a conventionally-known photolithographic method, and a part of the n-type semiconductor layer 140 (the n-type contact layer 140a in FIG. 1) is exposed by a conventionally-known etching method to form the exposed region 140c.

(p-Electrode and n-Electrode Forming Step)

As shown in FIG. 5F, the p-electrode 180 is formed on the transparent electrode 170, and the n-electrode 190 is formed on the exposed region 140c, using a conventionally-known method.

It should be noted that, if a structure or composition is different between the p-electrode 180 and the n-electrode 190, it is necessary to form the p-electrode 180 and the n-electrode 190 separately. On the other hand, if the p-electrode 180 and the n-electrode 190 have the same structure and composition, it is possible to form the p-electrode 180 and the n-electrode 190 at the same time; therefore, it is preferable because the number of production steps can be reduced.

Figure 6:
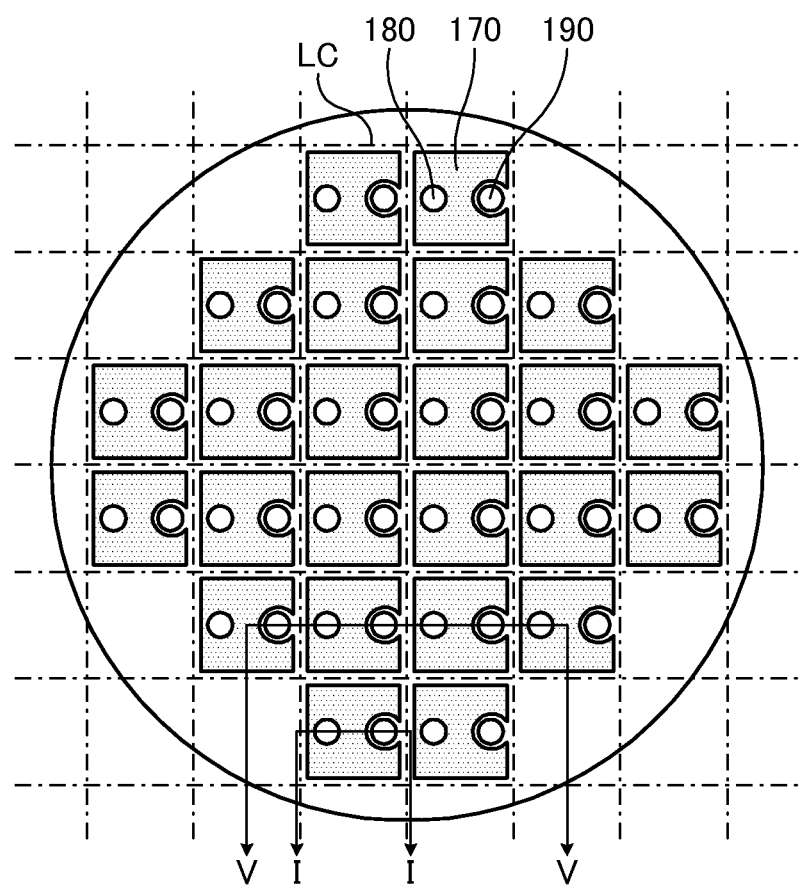
FIG. 6 is a diagram showing a surface of the substrate in the state shown in FIG. 5F.

FIG. 6 is a diagram showing a surface of the substrate 110 in the state shown in FIG. 5F. The transparent electrode 170, the p-electrode 180 and the n-electrode 190 are formed on every semiconductor light emitting element LC.

It should be noted that the cross-sectional view shown in FIG. 1 corresponds to a cross section taken along the line I-I in FIG. 6, and the cross section shown in each step of FIGS. 5A to 5G corresponds to a cross section taken along the line V-V.

(Substrate Dividing Step)

Figure 5G:
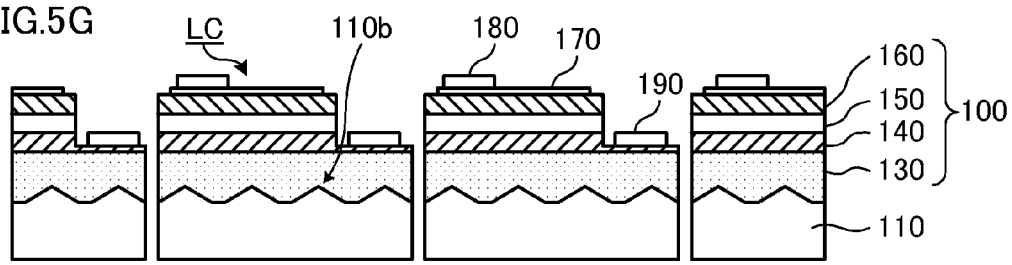

Next, as shown in FIG. 5G, the substrate 110 is divided into individual chips of the semiconductor light emitting element LC (step 105).

As a method of dividing the substrate 110 into the chips, a method may be used in which the inside of the substrate 110 is irradiated with laser light to change the irradiated part into a heat-modified region (weak region), and thereafter, the substrate 110 is mechanically divided. For example, from the back surface of the substrate 110, laser light is applied along dividing lines so as to be focused within the substrate 110. Then, in a part irradiated with the laser light within the substrate 110, a weak region is formed. Thereafter, by applying a mechanical force to the substrate 110, division is performed beginning with the weak region of the substrate 110 as a starting point of corruption.

As the laser light applied to the substrate 110, excimer-pumped pulse laser light, a $CO_2$ laser, a YAG laser and a lithium-yttrium-fluoride (YLF) laser having a wavelength of 266 nm can be used.

As described so far, the semiconductor light emitting element LC shown in FIG. 1 can be produced.

<Growth of Base Layer 130 on Substrate 110 on which Protrusions 110b has been Formed>

Here, a description will be given to the growth of the base layer 130 on the substrate 110 on which the protrusions 110b have been formed. It should be noted that, as described above, the description will be given on the assumption that the substrate 110 is sapphire, for example, and that the flat surface 110a, except for the portion of the protrusions 110b, is the C-plane of sapphire. Further, the GaN-based compound semiconductor that grows on the flat surface 110a is described as GaN as an example of the GaN-based compound semiconductor.

Figure 7A:
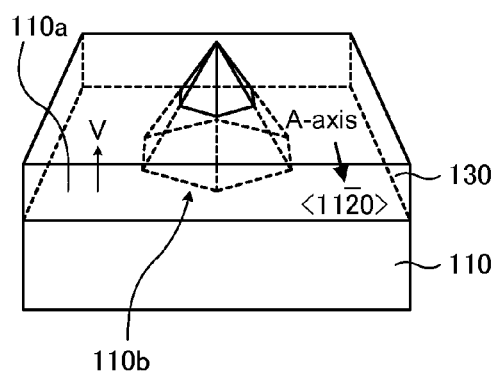
FIGS. 7A to 7D are diagrams showing a state where the base layer is formed on the substrate on which the protrusions in the exemplary embodiment are formed.
Figure 7B:
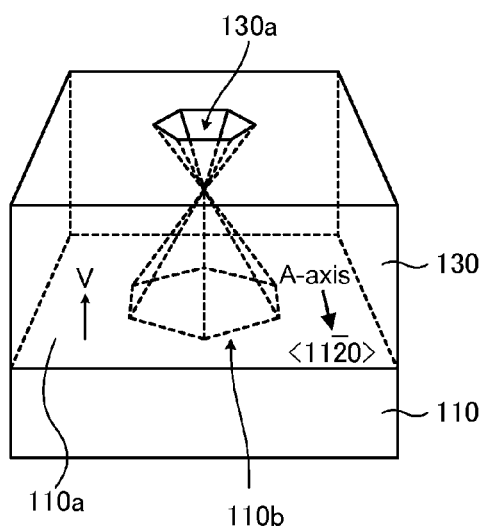
Figure 7C:
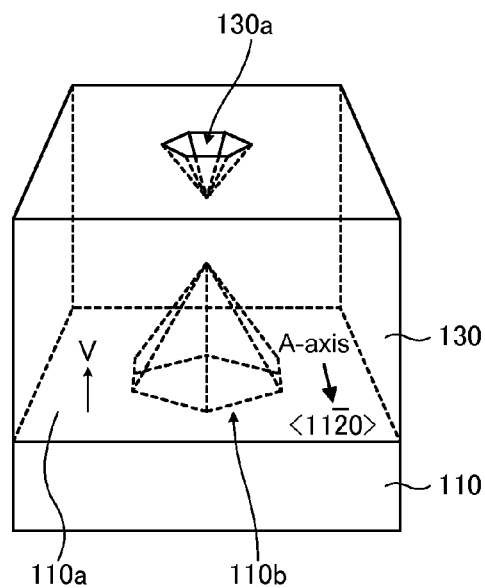
Figure 7D:
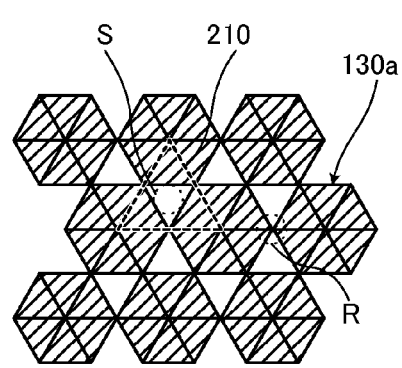

FIGS. 7A to 7D are diagrams showing a state where the base layer 130 is formed on the substrate 110 on which the protrusions 110b have been formed with an arrangement shown in FIGS. 2A and 2B. FIG. 7A is a perspective view in a stage where the base layer 130 has grown up to half the height of the protrusion 110b, FIG. 7B is a perspective view in a stage where the base layer 130 has grown to have a little thickness above the height of the protrusion 110b, and FIG. 7C is a perspective view in a stage where the base layer 130 has further grown. Then, FIG. 7D is a plan view of pits 130a, which are recesses in the inverted hexagonal-pyramid shape described later, as viewed from above.

In FIGS. 7A to 7D, as shown in FIGS. 2A and 2B, the A-axis direction (<11-20> direction) orthogonal to the A-plane (11-20) of sapphire and the direction of at least one of the pairs of two facing sides among six sides of the bottom surface (hexagon) of the protrusion 110b are made to be parallel.

On the substrate 110 made of sapphire whose C-plane is a principal plane, GaN grows so that the A-plane of sapphire ({11-20} plane) and the M-plane ({1-100} plane) of GaN become parallel. In the early stage of crystal growth of the base layer 130 (until the C-plane of GaN reaches the vertex of the protrusion 110b), GaN grows so that a hexagon including at least two sides that are parallel to <11-20> direction of sapphire appears at a boundary where GaN contacts the protrusions 110b. Accordingly, it is contemplated that crystal growth of GaN is able to occur on the substrate 110 without being inhibited by the protrusions 110b (refer to FIG. 7A). For this reason, in the early stage of crystal growth of the base layer 130 (until the C-plane of GaN reaches the vertex of the protrusion 110b), the base layer 130 having good crystallinity is formed.

Then, when the base layer 130 comes to exceed the height of the protrusions 110b, the pits 130a, which are recesses in the inverted hexagonal-pyramid shape, are formed from the vertices of the protrusions 110b as shown in FIG. 7B. It should be noted that the bottom surface of the pit 130a in the inverted hexagonal-pyramid shape is such that the protrusion 110b is rotated 30° with respect to the center of the bottom surface thereof.

GaN grows so as to bury the protrusions 110b from the flat surface 110a, which is the C-plane of sapphire, in the direction of arrow V. Consequently, it is contemplated that it is difficult for GaN to grow on the vertices of the protrusions 110b, and thereby the pits 130a are formed.

When the base layer 130 further grows, as shown in FIG. 7C, the vertex of the pit 130a in the inverted hexagonal-pyramid shape moves upwardly so as to be away from the vertex of the protrusion 110b, and the size of the pit 130a is reduced. Thereafter, the pits 130a disappear with the growth of the base layer 130, and the surface of the base layer 130 becomes flat.

As shown in FIG. 7B, the hexagon at the bottom surface of the protrusion 110b and the hexagon at the bottom surface of the pit 130a in the inverted hexagonal-pyramid shape are in a relation of being rotated 30° with respect to each other. Consequently, in the arrangement of the pits 130a in or after the mid-stage of crystal growth (the C-plane of GaN is on or above the height of the protrusion 110b), as shown in FIG. 7D, corners of the hexagons in the adjacent pits 130a face each other. Then, in a region R of the nearest distance between the adjacent pits 130a, facet planes, each of which is a crystal growth plane of the base layer 130, hit each other, and a dent is generated on the surface of the base layer 130. Further, in a region S enclosed by the regular triangle 210 on which the protrusions 110b are arranged, since the C-plane of GaN grows without any inhibition, it is impossible to reduce dislocation by the growth in the lateral direction.

In this way, in the substrate 110 on which the protrusions 110b are formed in the arrangement shown in FIGS. 2A and 2B, namely, in the substrate 110 in which the A-axis direction (<11-20> direction) orthogonal to the A-plane (11-20) of sapphire and the direction of at least one of the pairs of two facing sides among six sides of the bottom surface (hexagon) of the protrusion 110b are made to be parallel, the base layer 130 having good crystallinity is formed in the early stage of crystal growth of the base layer 130 (until the C-plane of GaN reaches the vertex of the protrusion 110b); meanwhile, in or after the mid-stage of crystal growth (the C-plane of GaN is on or above the height of the protrusion 110b), there occurs some cases where it is impossible to reduce dislocation in crystal growth due to the close region R between the adjacent pits 130a or the region S enclosed by the regular triangle 210 on which the protrusions 110b are arranged.

Figure 8A:
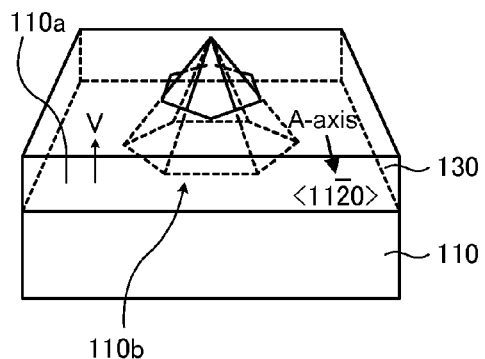
FIGS. 8A to 8D are diagrams showing a state where the base layer is formed on the substrate on which another arrangement of the protrusions in the exemplary embodiment are formed.
Figure 8B:
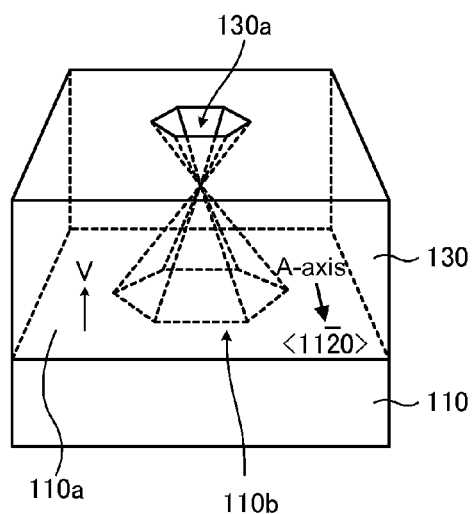
Figure 8C:
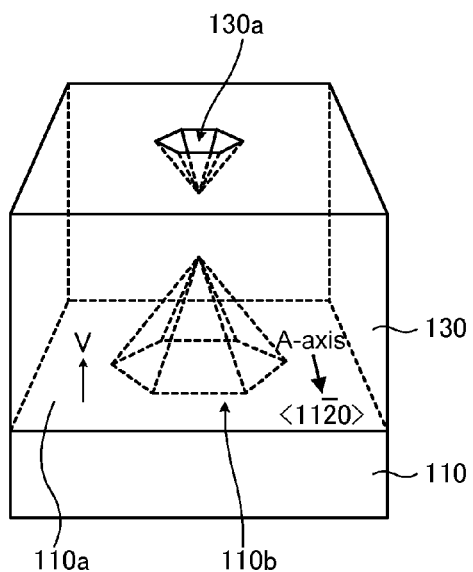
Figure 8D:
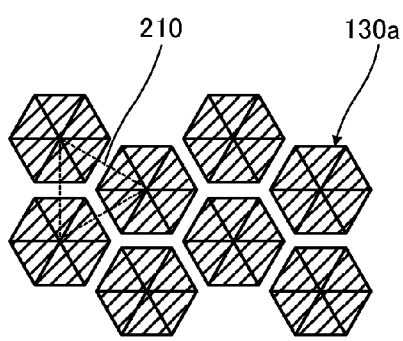

FIGS. 8A to 8D are diagrams showing a state where the base layer 130 is formed on the substrate 110 on which the protrusions 110b have been formed with an arrangement shown in FIGS. 3A and 3B. FIG. 8A is a perspective view in a stage where the base layer 130 has grown up to half the height of the protrusion 110b, FIG. 8B is a perspective view in a stage where the base layer 130 has grown to have a little thickness above the height of the protrusion 110b, and FIG. 8C is a perspective view in a stage where the base layer 130 has further grown. Then, FIG. 8D is a plan view of pits 130a, which are recesses in the inverted hexagonal-pyramid shape, as viewed from above.

In FIGS. 8A to 8D, as shown in FIG. 3A, the A-axis direction (<11-20> direction) and the direction of at least one of the pairs of two facing sides among six sides of the hexagon at the bottom surface of the protrusion 110b are made to be orthogonal.

The M-plane ({1-100} plane) of GaN-based compound semiconductor grows so as to be parallel to the A-plane ({11-

20} plane) of sapphire. Of the six sides of the bottom surface (hexagon) of the protrusion 110b, at least a pair of two facing sides is arranged to be orthogonal to the A-axis (<11-20> direction) of sapphire. In the early stage of crystal growth of the base layer 130 (until the C-plane of GaN reaches the vertex of the protrusion 110b), GaN grows so that a hexagon including at least two sides that are parallel to <11-20> direction of sapphire appears at a boundary where GaN contacts the protrusions 110b. Accordingly, in the early stage of crystal growth of the base layer 130 (until the C-plane of GaN reaches the vertex of the protrusion 110b), crystal growth is inhibited by the existence of the protrusions 110b; therefore it is contemplated that crystallinity is worse than the case of the arrangement in FIG. 2A (refer to FIG. 8A). In other words, it is contemplated that, since the crystal growth direction and the direction of sides of the hexagon at the bottom surface of the protrusion 110b do not coincide, crystallinity in proximity to the protrusion 110b is deteriorated compared to the arrangement of the protrusions 110b shown in FIG. 2A. However, as shown in FIG. 8D, crystallinity of the base layer 130 in or after the mid-stage of crystal growth becomes good because the sides of the hexagon of the bottom surface (at an upper side, because of the inverted hexagonal pyramid) of the pit 130a in the inverted hexagonal-pyramid shape that appears in or after the mid-stage of crystal growth (the C-plane of GaN is on or above the height of the protrusion 110b and until the pit 130a is buried) are substantially parallel between the adjacent pits 130a. That is to say, in the arrangement of the protrusions 110b shown in FIG. 3A, crystallinity of the base layer 130 in or after the mid-stage of crystal growth is significantly improved compared to the arrangement of FIG. 2A. Further, since the directions of sides coincide between the hexagon at the bottom surface of the pit 130a in the inverted hexagonal-pyramid shape that appears in or after the mid-stage and the hexagon at the bottom surface of the protrusion 110b, a crystal growth plane (facet plane) in the inverted hexagonal-pyramid shape can be obtained in an early stage of crystal growth, and thereby crystals having excellent crystallinity are provided with less thickness compared to the arrangement of the protrusions 110b shown in FIG. 2A.

In this manner, in the case where the protrusions 110b in the hexagonal-pyramid shape are arranged as shown in FIG. 3A, though crystallinity is not good in the early stage of crystal growth of the base layer 130 (refer to FIG. 8A) compared to the arrangement shown in FIG. 2A, in or after the mid-stage of crystal growth (refer to FIGS. 8B and 8C), good crystals can be obtained. In particular, in this arrangement, the C-plane of GaN, which is the base layer 130, becomes constant at every location irrespective of the size of the pits 130a (irrespective of growing conditions). Accordingly, it can be said that there is an advantage for collecting dislocations at the vertex portions of the protrusions 110b by selecting the growing conditions of GaN to increase the size of the pits 130a and causing growth in the lateral direction.

Figure 9A:
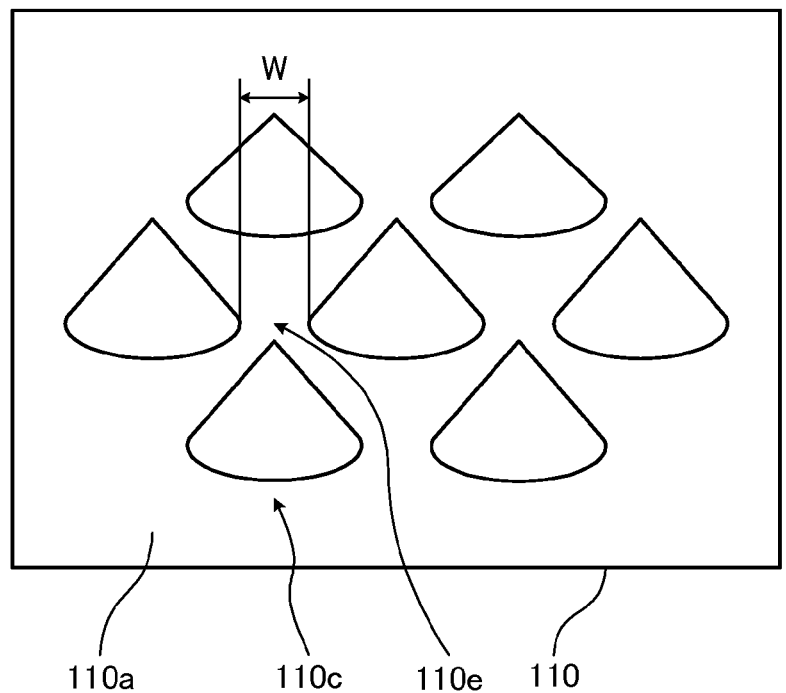
FIGS. 9A and 9B are diagrams showing shapes of protrusions different from that in the exemplary embodiment.
Figure 9B:
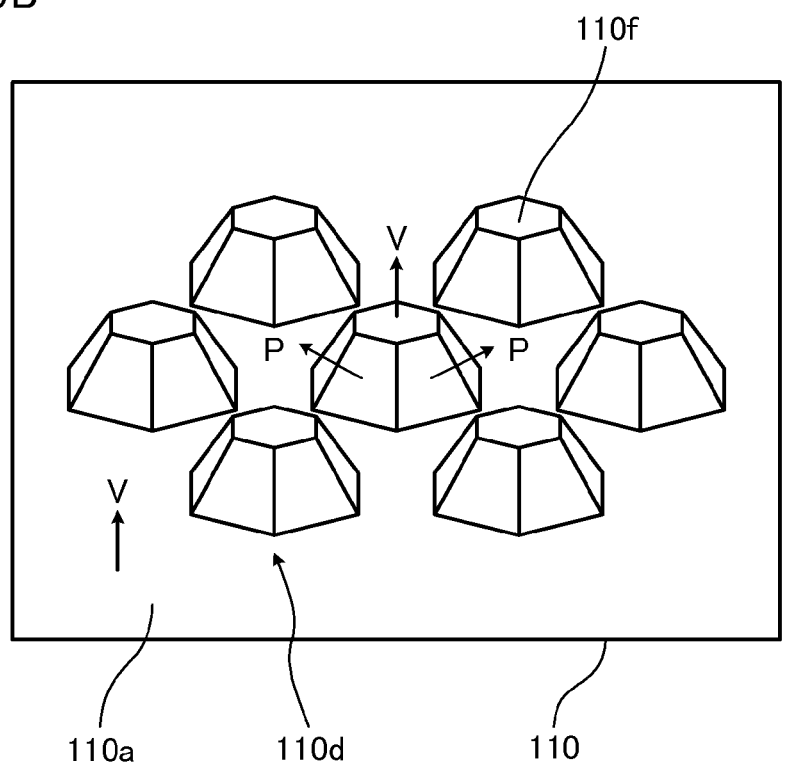

FIGS. 9A and 9B are diagrams showing, as comparative examples, shapes of protrusions (protrusions 110c and protrusions 110d) different from that in the exemplary embodiment. FIG. 9A shows protrusions 110c in a circular-conic shape and FIG. 9B shows protrusions 110d in a shape of hexagonal pyramid with an upper portion thereof being cut.

With regard to components similar to those in FIGS. 2A, 2B, 3A and 3B same reference numerals are assigned and detailed description is omitted.

In the protrusions 110c in the circular-conic shape shown in FIG. 9A, a distance W between bottom surfaces of adjacent protrusions 110c becomes shortest in a close portion 110e where two circles of the bottom surfaces are closest.

If the protrusions 110c in the circular-conic shape are brought close to one another to be densely arranged for improving light extraction efficiency, there occurs many cases where the surface in proximity to the bottom surface of the protrusion 110c in the circular-conic shape does not become a flat surface 110a, but has a trench thereon, and therefore, dislocations occur in the close portion 110e. Accordingly, it is necessary to suppress effects of dislocations to the n-type semiconductor layer 140, the light emitting layer 150 and the p-type semiconductor layer 160 by increasing the thickness of the base layer 130.

Further, with the protrusions 110c, since it is impossible to densely arrange the protrusions 110c on the substrate 110 and a distance in portions other than the close portion 110e becomes longer, it is difficult to increase light extraction efficiency.

In contrast, in the protrusions 110b in the hexagonal-pyramid shape in the exemplary embodiment shown in FIGS. 2A, 2B, 3A and 3B, the distance W between the sides of the hexagons of the bottom surfaces of the adjacent protrusions 110b (refer to FIGS. 2A and 3A) is constant. Consequently, it is possible to keep the area of the flat surface 110a at minimum, reduce the distance between the protrusions 110b and arrange the protrusions 110b densely; therefore, improve the light extraction efficiency.

Incidentally, in the protrusions 110d in the shape of hexagonal pyramid with the upper portion being cut as shown in FIG. 9B, as well as growth of the base layer 130 in the direction of arrow V from the flat surface 110a between the protrusions 110d, the base layer 130 also grows in the direction of arrow V from a flat surface 110f at the upper portion of the protrusion 110d. Therefore, at a boundary between the portion of the base layer 130 that has grown from the flat surface 110a and the portion of the base layer 130 that has grown from the flat surface 110f at the upper portion of the protrusion 110d, dislocations occur or crack is formed, and thereby crystallinity of the base layer 130 is deteriorated.

As shown in the exemplary embodiment, in the protrusions 110b in the hexagonal-pyramid shape, growth is carried out so that the pits 130a are gradually reduced in size as shown in FIGS. 7A to 7D and 8A to 8D, and accordingly, the base layer 130 having good crystallinity is available.

It should be noted that, if the n-type semiconductor layer 140 having excellent crystallinity can be formed on the substrate 110 on which the protrusions 110b have been formed, the base layer 130 may be omitted.

<Semiconductor Light Emitting Device 1>

Next, an example of a method of using the semiconductor light emitting element LC shown in FIG. 1 will be described.

Figure 10A:
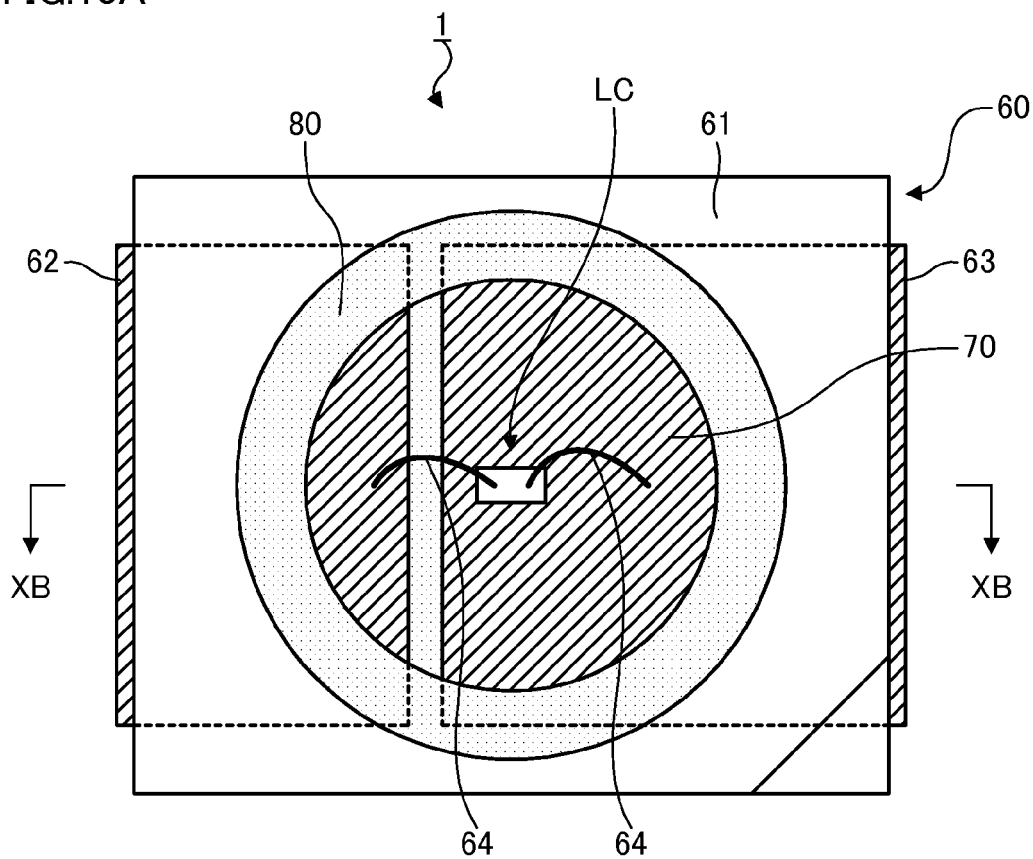
FIGS. 10A and 10B are diagrams showing an example of a configuration of the semiconductor light emitting device 1 in which the semiconductor light emitting element in the exemplary embodiment is mounted in a package.
Figure 10B:
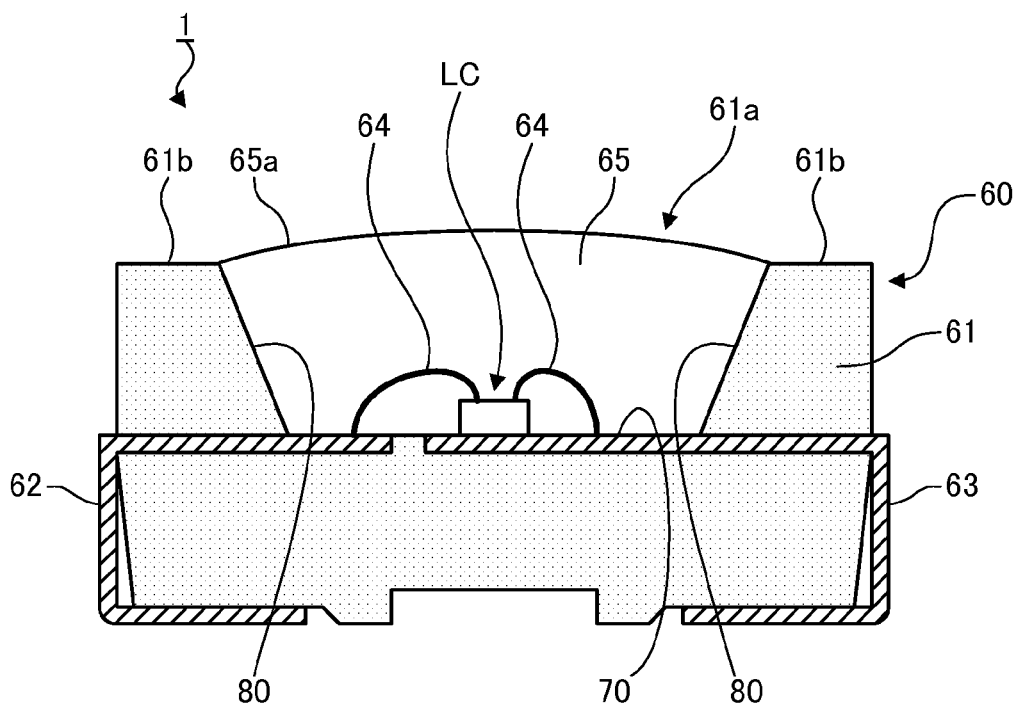

FIGS. 10A and 10B are diagrams showing an example of a configuration of a semiconductor light emitting device 1 in which the semiconductor light emitting element LC in the exemplary embodiment is mounted on a package 60. FIG. 10A is a top view of the semiconductor light emitting device 1, and FIG. 10B is a cross-sectional view taken along the line XB-XB in FIG. 10A.

The semiconductor light emitting device 1 includes the package 60 and the semiconductor light emitting element LC mounted on the package 60.

The package 60 includes a resin container 61 in which an opening portion 61a is formed on an upper portion side thereof, an anode lead portion 62 and a cathode lead portion 63 that are formed by a lead frame integrated with the resin container 61, and a sealing resin 65 provided to cover the opening portion 61a.

The semiconductor light emitting element LC is secured at a bottom surface 70 of the opening portion 61a of the package 60. The sealing resin 65 is provided to also cover the semiconductor light emitting element LC.

It should be noted that illustration of the sealing resin 65 is omitted in FIG. 10A.

The resin container 61 of the package 60 is formed by injection molding of a thermoplastic resin containing a white pigment over a metal lead portion including the anode lead portion 62 and the cathode lead portion 63. As the white pigment, for example, fine-grained titania (titanium oxide) is used. Further, as the thermoplastic resin, PPA (polyphthalamide) is most commonly used, but liquid crystal polymer, epoxy resin, polystyrene or the like may also be employed.

The opening portion 61a provided in the resin container 61 includes the bottom surface 70 having a circular shape and a wall surface 80 that rises up from an edge around the bottom surface 70 so as to open toward the upper portion side of the resin container 61. Here, the bottom surface 70 is configured with the anode lead portion 62 and the cathode lead portion 63 both exposed at the opening portion 61a and the white resin of the resin container 61 that exposes at a clearance between the anode lead portion 62 and the cathode lead portion 63.

The anode lead portion 62 and the cathode lead portion 63 are held while part of each being caught in the resin container 61 and the other part of each being exposed to the outside of the resin container 61 to serve as a terminal for applying a current to the semiconductor light emitting element LC. On the premise of the surface mount technology, as shown in FIGS. 10A and 10B, it is preferable to bend each of the anode lead portion 62 and the cathode lead portion 63 toward the back side of the resin container 61 so as to provide a tip end thereof on a bottom portion of the resin container 61.

The semiconductor light emitting element LC is bonded on the cathode lead portion 63 exposed at the bottom surface 70 by die bonding adhesive made of silicone resin or epoxy resin and secured.

In the semiconductor light emitting element LC, the p-electrode 180 and the n-electrode 190 are connected to the anode lead portion 62 and the cathode lead portion 63, respectively, via a bonding wire 64. It should be noted that, in the semiconductor light emitting device 1, as shown in FIG. 10A, the semiconductor light emitting element LC is attached to the nearly central portion of the bottom surface 70 having a circular shape.

As the sealing resin 65, various kinds of resin that is transparent in the visible region may be applied, but from the viewpoint of heat-resistivity, it is preferable to use silicone resin.

Further, the sealing resin 65 may be a transparent resin in which phosphor that absorbs light emitted from the semiconductor light emitting element LC and then emits light of longer wavelength is uniformly dispersed. For example, a green phosphor that absorbs the blue light emitted from the semiconductor light emitting element LC and then emits green light, and a red phosphor that absorbs the blue light emitted from the semiconductor light emitting element LC and then emits red light may be contained. Owing to the blue light emitted by the semiconductor light emitting element LC, the green light emitted by the green phosphor contained in the transparent resin and the red light emitted by the red phosphor similarly contained in the transparent resin, three primary colors of blue, green and red are completed. This may allow white light to be emitted from a top surface of the sealing resin 65, namely, an emitting surface 65a from which light is emitted.

Then, description will be given to light emitting operation of the semiconductor light emitting device 1 shown in FIGS. 10A and 10B.

When a current is fed to the semiconductor light emitting element LC while assuming the anode lead portion 62 as a positive electrode and the cathode lead portion 63 as a negative electrode, the semiconductor light emitting element LC emits blue light. The blue light emitted by the semiconductor light emitting element LC (the light heading for the direction of arrow C in FIG. 1 and the light heading for the lateral direction from the light emitting layer 150) proceeds within the sealing resin 65, and is emitted from the emitting surface 65a to the outside directly or after being reflected by the bottom surface 70 or the wall surface 80. However, part of the light heading for the emitting surface 65a is reflected by the emitting surface 65a and proceeds within the sealing resin 65 again. During this time, in the case where the sealing resin 65 contains the phosphor, part of the blue light is converted into the green light and the red light by the phosphor, and the converted green light and red light are emitted from the emitting surface 65a to the outside together with the blue light directly or after being reflected by the bottom surface 70 or the wall surface 80. Consequently, the white light containing the blue light, the green light and the red light is emitted from the emitting surface 65a.

Subsequently, a producing method of the semiconductor light emitting device 1 shown in FIGS. 10A and 10B will be described.

First, injection molding of the white resin is conducted on the lead frame in which the anode lead portion 62 and the cathode lead portion 63 are integrated to form the resin container 61 provided with the opening portion 61a. Next, the semiconductor light emitting element LC is bonded and fixed on the cathode lead portion 63 exposed on the bottom surface 70 of the opening portion 61a in the resin container 61, and the p-electrode 180 and the n-electrode 190 of the semiconductor light emitting element LC are connected to the anode lead portion 62 and the cathode lead portion 63, respectively, by the bonding wire 64.

Next, the opening portion 61a is filled with a transparent resin paste (that may contain the phosphor) in an uncured state by a potting method using a discharge device. On that occasion, the semiconductor light emitting element LC and the bonding wire 64 are covered with the transparent resin paste in the uncured state, and a liquid surface of the transparent resin paste in the uncured state is caused to be projected more than a top surface 61b of the resin container 61 by use of a surface tension.

Next, the sealing resin 65 is formed by curing the transparent resin paste in the uncured state. As the curing process, for example, heating may be conducted. Thereafter, cutting for separating the lead frame into the anode lead portion 62 and the cathode lead portion 63, and bending of the lead frame are carried out to obtain the semiconductor light emitting device 1.

In the exemplary embodiment, the description was given to the semiconductor light emitting element LC that emits blue light. However, the semiconductor light emitting element LC may be that emitting light of other color, such as infrared light, red light, green light and ultraviolet light.

Further, the semiconductor light emitting device 1 in which the semiconductor light emitting element LC in the exemplary embodiment was mounted on the package 60 was described. Other than this, a semiconductor light emitting device may be configured by mounting the semiconductor light emitting element LC in the exemplary embodiment on a circuit board on which an anode lead portion and a cathode lead portion are provided, and connecting the p-electrode 180 and the n-electrode 190 of the semiconductor light emitting element LC to the anode lead portion and the cathode lead portion, respectively, by a bonding wire.

Objects to which the semiconductor light emitting device 1 is able to be applied include an illumination device, and further, an electronic device such as a liquid crystal display and an LED display.

REFERENCE SIGNS LIST

1 . . . Semiconductor light emitting device
60 . . . Package
61 . . . Resin container
100 . . . Laminated semiconductor layer
110 . . . Substrate
110b, 110c, 110d . . . Protrusion
120 . . . Mask
130 . . . Base layer
130a . . . Pit
140 . . . n-type semiconductor layer
150 . . . Light emitting layer
160 . . . p-type semiconductor layer
170 . . . Transparent electrode
180 . . . p-electrode
190 . . . n-electrode
LC . . . Semiconductor light emitting element

The invention claimed is:

1. A substrate for laminating a semiconductor layer thereon, wherein a plurality of protrusions in a hexagonal-pyramid shape is provided directly on the surface on which the semiconductor layer is laminated, and a side of the bottom surface of each of the plurality of protrusions is set in parallel with a side of the bottom surface of an adjacent protrusion,
wherein the substrate is composed of single crystal sapphire whose C-plane is a principal plane, and
at least two parallel sides of the hexagon of the bottom surface of each protrusion in the hexagonal-pyramid shape among the plurality of protrusions are set in parallel with an A-axis of the substrate.

2. The substrate according to claim 1, wherein the plurality of protrusions provided on the substrate is arranged by locating centers of the bottom surfaces of three protrusions adjacent to one another among the plurality of protrusions on corners of a triangle, and repeating the triangle.

3. A substrate for laminating a semiconductor layer thereon, wherein a plurality of protrusions in a hexagonal-pyramid shape is provided directly on the surface on which the semiconductor layer is laminated, and a side of the bottom surface of each of the plurality of protrusions is set in parallel with a side of the bottom surface of an adjacent protrusion,
wherein the substrate is composed of single crystal sapphire whose C-plane is a principal plane, and
at least two parallel sides of the hexagon of the bottom surface of each protrusion in the hexagonal-pyramid shape among the plurality of protrusions are set orthogonal to an A-axis of the substrate.

4. A template substrate comprising:
a substrate on one surface of which a plurality of protrusions in a hexagonal-pyramid shape is provided, a side of the bottom surface of each of the plurality of protrusions being set in parallel with a side of the bottom surface of an adjacent protrusion; and
a group III-V compound semiconductor that is epitaxially grown on the one surface of the substrate,
wherein the substrate is composed of single crystal sapphire whose C-plane is a principal plane, and
at least two parallel sides of the hexagon of the bottom surface of each protrusion in the hexagonal-pyramid shape among the plurality of protrusions are set in parallel with an A-axis of the substrate.

5. The template substrate according to claim 4, wherein the group III-V compound semiconductor is a compound semiconductor containing gallium (Ga) and nitrogen (N) in a composition thereof.

6. A semiconductor light emitting element comprising:
a substrate on one surface of which a plurality of protrusions in a hexagonal-pyramid shape is provided, and a side of a bottom surface of each of the plurality of protrusions is set in parallel with a side of a bottom surface of an adjacent protrusion; and
a laminated semiconductor layer that is provided on the substrate and includes a light emitting layer to emit light of a predetermined wavelength,
wherein the substrate is composed of single crystal sapphire whose C-plane is a principal plane, and
at least two parallel sides of the hexagon of the bottom surface of each protrusion in the hexagonal-pyramid shape among the plurality of protrusions are set in parallel with an A-axis of the substrate.

7. A method for producing the semiconductor light emitting element as claimed in claim 6, the method comprising:
a substrate processing step in which a plurality of protrusions in a hexagonal-pyramid shape is provided on one surface of the substrate so that bottom surfaces thereof are adjacent so that two sides become parallel; and
a laminated semiconductor layer forming step in which a laminated semiconductor layer including a light emitting layer to emit light of a predetermined wavelength is formed on the substrate.

8. The method according to claim 7, wherein the substrate processing step comprises:
a mask forming step in which a plurality of masks having a planar shape similar to a shape of the bottom surface of the protrusion in the hexagonal-pyramid shape is formed; and
a substrate etching step in which the plurality of protrusions is formed while reducing the planar shape of the plurality of masks by dry etching.

9. An illumination device comprising a semiconductor light emitting element, the semiconductor light emitting element including:
a substrate on one surface of which a plurality of protrusions in a hexagonal-pyramid shape is provided, a side of the bottom surface of each of the plurality of protrusions being set in parallel with a side of the bottom surface of an adjacent protrusion; and
a laminated semiconductor layer that is provided on the substrate and includes a light emitting layer to emit light of a predetermined wavelength,
wherein the substrate is composed of single crystal sapphire whose C-plane is a principal plane, and
at least two parallel sides of the hexagon of the bottom surface of each protrusion in the hexagonal-pyramid shape among the plurality of protrusions are set in parallel with an A-axis of the substrate.

10. An electronic device comprising a semiconductor light emitting element, the semiconductor light emitting element including:
a substrate on one surface of which a plurality of protrusions in a hexagonal-pyramid shape is provided, a side of the bottom surface of each of the plurality of protrusions being set in parallel with a side of the bottom surface of an adjacent protrusion; and a laminated semiconductor layer that is provided on the substrate and includes a light emitting layer to emit light of a predetermined wavelength,
wherein the substrate is composed of single crystal sapphire whose C-plane is a principal plane, and
at least two parallel sides of the hexagon of the bottom surface of each protrusion in the hexagonal-pyramid shape among the plurality of protrusions are set in parallel with an A-axis of the substrate.

* * * * *